(12) United States Patent
Machida et al.

(10) Patent No.: US 7,759,209 B2
(45) Date of Patent: Jul. 20, 2010

(54) SEMICONDUCTOR DEVICE AND A METHOD OF MANUFACTURING THE SAME

(75) Inventors: Satoru Machida, Tokyo (JP); Yasushi Ishii, Tokyo (JP); Toshio Kudo, Tokyo (JP); Masato Takahashi, Tokyo (JP); Yukihiro Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 471 days.

(21) Appl. No.: 11/700,865

(22) Filed: Feb. 1, 2007

(65) Prior Publication Data

US 2007/0215930 A1 Sep. 20, 2007

(30) Foreign Application Priority Data

Mar. 20, 2006 (JP) ............................ 2006-075948

(51) Int. Cl.
*H01L 29/76* (2006.01)

(52) U.S. Cl. ...................................... 438/305; 257/314

(58) Field of Classification Search ................. 257/239, 257/E29.129, 228, 401, 901; 438/43, 257, 438/593, 292–308
See application file for complete search history.

(56) References Cited

U.S. PATENT DOCUMENTS

| | | | |
|---|---|---|---|
| 6,221,764 B1 | 4/2001 | Inoue | |
| 6,297,148 B1 | 10/2001 | Besser et al. | |
| 6,656,808 B2 * | 12/2003 | Kwean | 438/305 |
| 6,696,340 B2 * | 2/2004 | Furuhata | 438/257 |
| 7,132,718 B2 * | 11/2006 | Hisamoto et al. | 257/407 |
| 2001/0034101 A1 * | 10/2001 | Sueyoshi | 438/305 |
| 2002/0123211 A1 * | 9/2002 | Dolan et al. | 438/480 |
| 2004/0119107 A1 | 6/2004 | Hisamoto et al. | |
| 2004/0121591 A1 | 6/2004 | Ichinose et al. | |
| 2005/0085039 A1 | 4/2005 | Yasui et al. | |
| 2005/0272198 A1 * | 12/2005 | Hamamura et al. | 438/230 |

FOREIGN PATENT DOCUMENTS

| | | |
|---|---|---|
| JP | 11-283935 A | 10/1999 |
| JP | 2001-203352 A | 7/2001 |
| JP | 2002-231829 A | 8/2002 |
| JP | 2004-193447 A | 7/2004 |

OTHER PUBLICATIONS

Marvin Tabasky et al. "Direct Silicidation of Co on Si by Rapid Thermal Annealing", IEEE Transactions on Electron Devices, vol. ED-34, No. 3, Mar. 1987, pp. 548-553.

* cited by examiner

*Primary Examiner*—David Vu
*Assistant Examiner*—Jonathan Han
(74) *Attorney, Agent, or Firm*—Miles & Stockbridge P.C.

(57) ABSTRACT

A memory cell has a control gate electrode disposed on a main surface of a semiconductor substrate through a gate insulating film, an ONO film disposed along a side surface of the control gate electrode and the main surface of semiconductor substrate, a memory gate electrode disposed on a side surface of the control gate electrode and also on the main surface of the semiconductor substrate through the ONO film. The control gate electrode and the memory gate electrode are formed, over the upper portions thereof, with a silicide film and an insulating film formed by oxidation of the surface of the silicide film, respectively.

26 Claims, 19 Drawing Sheets

SEMICONDUCTOR DEVICE AND A METHOD OF MANUFACTURING THE SAME

CROSS-REFERENCE TO RELATED APPLICATION

The present application claims priority from Japanese patent application No. 2006-75948 filed on Mar. 20, 2006, the content of which is hereby incorporated by reference into this application.

BACKGROUND OF THE INVENTION

This invention relates to a semiconductor device and also to a manufacturing technique thereof, and more particularly, to a technique effective for application to a semiconductor device using a silicide film.

Since electrically rewritable, non-volatile memory devices such as EEPROM (Electrically Erasable Programmable Read Only Memory), a flash memory and the like are able to execute onboard rewriting of program, their applications are now spreading to a diversity of uses such as of high mix low volume manufacturing services, tuning for destination classification, update of program after shipment and the like, aside from the reduction of development period and the possibility of improving a developing efficiency. Especially, in recent years, there is a need for microcomputers building MPU (micro processing unit) and EEPROM (or a flash memory) thereinto.

For the microfabrication and high-speed operation of such microcomputers, a salicide (self-aligned silicide) technology has been applied to. For instance, in order to realize a low resistance, as a contact, of a silicon surface of an electrode or diffusion layer of MISFET (Metal Insulator Semiconductor Field Effect Transistor, which is hereinafter referred to simply as MIS transistor), the salicide technique is applied to the silicon surface to form a silicide film thereon.

In IEEE Trans. Electron Devices, entitled "Direct silicidation of CO on Si by rapid thermal annealing", vol. ED-34, p. 548, 1987, M. Tabasky, E. S. Bulat, B. M. Ditchek, M. A. Sullivan, and S. C. Shatas have reported a technique wherein using RTA (rapid thermal anneal) for silicidation anneal, a cobalt (Co) film on polysilicon or a diffusion layer is silicidated into $CoSi_2$ of a low sheet resistance.

In Japanese Unexamined Patent Publication No. Hei 11 (1999)-283935, there is disclosed a technique wherein a cobalt film is deposited on the surface of a diffusion layer and subjected to first annealing, and an unreacted cobalt film is subsequently removed, after which second annealing is carried out to form a $CoSi_2$ film.

In Japanese Unexamined Patent Publication No. 2004-193447, a technique is disclosed wherein a cobalt film is deposited on the surface of a diffusion layer and subjected to first annealing and further to second annealing, after which an unreacted cobalt film is removed, followed by third annealing to form a $CoSi_2$ film.

Japanese Unexamined Patent Publication No. 2001-203352 discloses a technique wherein a cobalt film is deposited on the surface of a diffusion layer and subjected to first annealing, and an unreacted cobalt film is oxidized and the resulting cobalt oxide film is removed, after which second annealing is carried out to form a $CoSi_2$ film.

In Japanese Unexamined Patent Publication No. 2002-231829, a technique is disclosed wherein a non-volatile memory having a memory gate and a control gate is deposited with a $CoSi_2$ film on upper portions of both gates.

SUMMARY OF THE INVENTION

We have made studies on microcomputers which are provided with a non-volatile memory of the MONOS (Metal Oxide Nitride Oxide Semiconductor) type having a split structure composed of a control gate electrode and a memory gate electrode (hereinafter referred to simply as "memory cell") and various types of MIS transistors constituting a peripheral circuit (hereinafter referred to as "peripheral transistor or transistors). It will be noted that for various types of MIS transistors constituting a peripheral circuit, mention is made, for example, a low withstand voltage n-channel MIS transistor, a low withstand voltage p-channel MIS transistor, a high withstand voltage n-channel transistor and a high withstand voltage MIS transistor.

The semiconductor devices provided with a memory cell and a peripheral transistor, which have been studied by the inventors, are illustrated with reference to the accompanying drawings.

FIG. 16 is a schematic sectional view showing an essential part of a memory cell MCa studied by us. As shown in FIG. 16, the memory cell MCa investigated by us is formed, for example, on a main surface of a semiconductor substrate (hereinafter referred to simply as "substrate") 1 made, for example, of a p-type single crystal silicon substrate.

The memory cell MCa includes a source region (S) and a drain region (D), each made of an n-type diffusion layer 13 formed on the main surface of the substrate 1. The n-type diffusion layer 13 makes up of an LDD (lightly doped drain) structure along with an n-type diffusion layer 11.

A control gate electrode CG of a selection MIS transistor and a memory gate electrode MG of a memory MIS transistor are arranged adjacently to each other on the main surface of the substrate 1 between the source region and the drain region. The control gate electrode CG is disposed on the main surface of the substrate 1 through a gate insulating film 5. On the other hand, the memory gate electrode MG is disposed on a side surface at one side of the control gate electrode CG and is insulated from the control gate electrode CG by means of an ONO film 9 of an oxide film 9a, a nitride film 9b and an oxide film 9c that are formed in this order from the side of the control gate electrode CG. The memory gate electrode MG is arranged on the main surface of the substrate 1 through the ONO film 9. These control gate electrode CG and memory gate electrode MG are, respectively, made of a polysilicon film doped with an impurity.

A silicide film 115 is formed on the control gate electrode CG, memory gate electrode MG and n-type diffusion layer 13. The salicide technique used by us is briefly illustrated below. A cobalt (Co) film is, for example, formed on the main surface of the substrate 1 so as to cover the control gate electrode CG, the memory gate electrode MG and the like therewith and is subjected to a first thermal treatment (first annealing) to form a CoSi film on the silicon (Si) surface of the electrode and diffusion layer. An unreacted Co film is removed by wet etching, followed by a second thermal treatment (second annealing), thereby permitting the CoSi film to undergo phase transformation into a $CoSi_2$ film. It will be noted that the first annealing temperature is at about 470° C. and the second annealing temperature is at about 710° C.

As stated hereinabove, the control gate electrode CG and the memory gate electrode MG have to be insulated from each other through the ONO film 9 in order that the respective MIS transistors are operated. It will be noted that in case where the thickness of the ONO film 9 is set at about 20 nm, the distance between the control gate electrode CG and the memory gate electrode MG becomes about 20 nm.

However, as shown by a broken line circle A in FIG. 16, there is the possibility that short-circuiting between the control gate electrode CG and the memory gate electrode MG is caused by means of the silicide film 115, which results in the operation failure that a desired voltage is not applied to the memory gate electrode MG. This is considered for the reason that in the step of using the salicide technique wherein the silicide film 115 is formed on the control gate electrode CG and the memory gate electrode MG, the silicide film 115 grows in lateral directions in addition to the growth in an upper direction, thereby forming the silicide film 115 on the ONO film 9 from the sides of the control gate electrode CG and the memory gate electrode MG.

Further, in view of the withstand voltage characteristic between the control gate electrode CG and the memory gate electrode MG shown in FIG. 17, a leak current (eddy current) generates even in case where a voltage applied between the control gate electrode CG and the memory gate electrode MG is low. FIG. 17 is a graphical representation illustrating the withstand voltage characteristic between the control gate electrode CG and the memory gate electrode MG of the memory cell MCa in FIG. 16.

More particularly, although the control gate electrode CG and the memory gate electrode MG have to be insulated from each other, these electrodes CG and MG are electrically short-circuited via the silicide film 115 on the ONO film 9. This short-circuiting failure would cause the reliability and manufacturing yield of a semiconductor device to be lowered.

To cope with this, we have carried out first annealing for the formation of a CoSi film at low temperatures (e.g. about 420° C.) so as not to form a silicide film 115 over the ONO film 9. FIG. 18 is a schematic sectional view showing an essential part of other type of memory cell MCb checked by us, in which a memory cell MCb fabricated by use of a salicide technique wherein first annealing is carried out at low temperatures is shown.

As shown in broken line circle B of FIG. 18, the silicide film 115 is prevented from formation on the ONO film 9 between the control gate electrode CG ad the memory gate electrode MG. However, as will be seen from the withstand voltage characteristic between the control gate electrode CG and the memory gate electrode MG shown in FIG. 19, a leak current (eddy current) occurs in some cases, thus making it impossible to completely suppress a leak current. FIG. 19 is a graphical representation illustrating the withstand voltage characteristic between the control gate electrode CG and the memory gate electrode MG of the memory cell MCb in FIG. 18.

More particularly, although the control gate electrode CG and the memory gate electrode MG have to be insulated from each other, these electrodes CG and MG are electrically short-circuited via the silicide film 115 on the ONO film 9. This short-circuiting failure would cause the reliability and manufacturing yield of semiconductor device to be lowered.

FIG. 20 is a schematic sectional view illustrating a peripheral transistor checked by us, in which a low withstand voltage n-channel MIS transistor is shown. As shown in FIG. 20, a peripheral transistor Qa studied by us is formed on a main surface of a substrate 1.

A source region (S) and drain region (D) of the peripheral transistor Qa are, respectively, made of an n-type diffusion layer 13 formed on the main surface of the substrate 1. The n-type diffusion layer 13 constitutes an LDD (lightly doped drain) structure along with an n-type diffusion layer 11.

A gate electrode G of MIS transistor is disposed on the main surface of the substrate 1 between the source region and the drain region. The gate electrode G is formed on the main surface of the substrate 1 through a gate insulating film 5. This gate electrode G is made of a polysilicon film doped with an impurity.

A silicide film 115 is formed onto the gate electrode G and the n-type diffusion layer 13 according to a salicide technique. The salicide technique employed by us is just as having set out hereinbefore.

At the active end indicated by broken line circle C of FIG. 20, the distance between the silicide film 115 and the junction face of the n-type diffusion layer 13/p-type well 4 is so close that a problem arises on a current leak to the substrate 1. Moreover, in the silicide film 115 on the gate electrode G and also on the n-type diffusion layer 13, there exists a leak through the side wall. This leak would cause reliability and manufacturing yield of the semiconductor device to be lowered.

An object of the invention is to provide a technique capable of improving reliability of a semiconductor device.

Another object of the invention is to provide a technique capable of improving a manufacturing yield of a semiconductor device.

The above and other objects and novel features of the invention will become apparent from the following description and the accompanying drawings.

Typical aspects of the invention are briefly described below.

The invention contemplates to provide a technique wherein a control gate electrode and a memory gate electrode are, respectively, formed on the upper portion thereof, with a silicide film and also with an oxide film formed by oxidation of the silicide film on the surface thereof.

The invention also contemplates to provide a technique wherein a silicide film is formed by a first thermal treatment and a second thermal treatment wherein an oxide film is formed on the surface of the silicide film according to the second thermal treatment carried out in an atmosphere containing oxygen.

The effects attained by typical aspects of the invention are briefly described below.

The effects attained by the invention are such that the resulting semiconductor device can be improved in reliability and also in manufacturing yield.

DETAILED DESCRIPTION OF THE PREFERRED EMBODIMENTS

Figure 1:
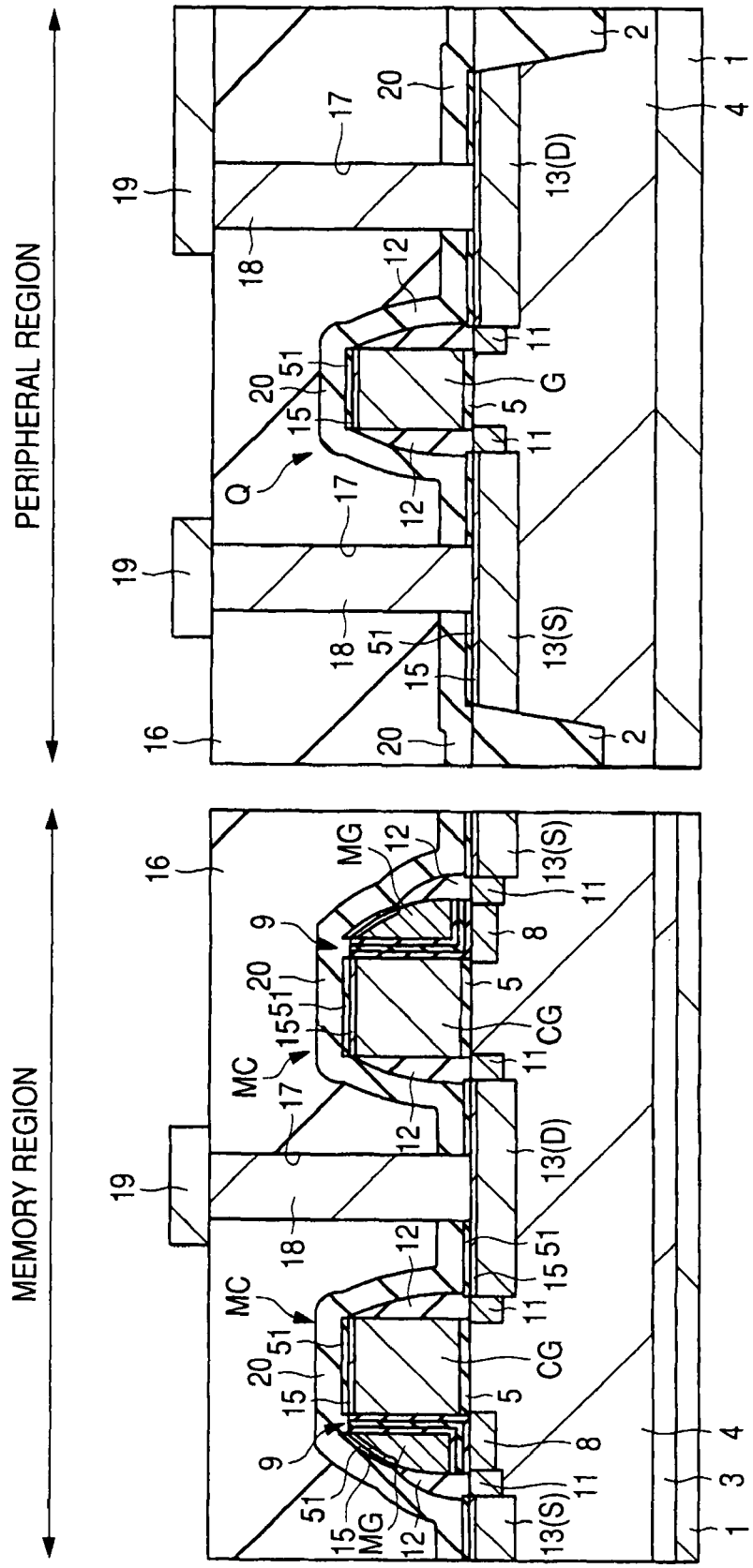
FIG. 1 is a schematic sectional view showing an essential part of a semiconductor device according to one embodiment of the invention.

The embodiments of the invention are described in more detail with reference to the accompanying drawings. It will be noted that throughout the drawings, like reference numerals indicate in principle like parts or members and are not repeatedly illustrated.

The semiconductor device according to one embodiment of the invention is one, e.g. a microcomputer, which includes a MONOS (Metal Oxide Nitride Oxide Semiconductor) non-volatile memory device (hereinafter referred to simply as "memory cell") having a split structure made up of a control gate electrode and a memory gate electrode, and a number of MIS transistors constituting a peripheral circuit (hereinafter referred to simply as "peripheral transistor or transistors"). For a number of MIS transistors constituting a peripheral circuit, mention is made, for example, of a low withstand voltage n-channel MIS transistor, a low withstand voltage p-channel MIS transistor, a high withstand voltage n-channel transistor and a high withstand voltage p-channel MIS transistor.

Initially, a semiconductor device provided with a memory cell and a peripheral transistor is illustrated with reference to the accompanying drawings.

FIG. 1 is a sectional view schematically showing an essential part of a semiconductor device according to this embodiment. As shown in FIG. 1, a memory cell MC having a control gate electrode CG and a memory gate electrode MG is formed on a memory region of a main surface of a semiconductor substrate (hereinafter referred to simply as "substrate") 1. At a peripheral region on the main surface of the substrate 1, a peripheral transistor Q having a gate electrode G is formed. That is, the memory cell constituting a memory array and the peripheral transistor constituting a peripheral circuit of the memory cell are, respectively, shown in FIG. 1. A silicide film 15 made, for example, of a cobalt silicide film is formed on an upper portion of the control gate electrode CG and also on an upper portion of the memory gate electrode MG. The cobalt silicide film is so low in resistance as a titanium silicide film and is one that is able to suppress a resistance rise as would be caused by thin wires in a microfabricating process.

A source region(S) and a drain region (D) of the memory cell MC are composed of an n-type diffusion layer 13 formed on the main surface of the substrate 1. The n-type diffusion layer 13 makes up of an LDD (lightly doped drain) structure along with an n-type diffusion layer 11.

The control gate electrode CG of a selection MIS transistor and the memory gate electrode MG of a memory MIS transistor is adjacently disposed on the main surface of the substrate 1 at a portion between the source region and the drain region. The control gate electrode CG is formed on the main surface of the substrate 1 through a gate insulating film 5. On the other hand, the memory gate electrode MG is provided on a side face at one side of the control gate electrode CG and is insulated from the control gate electrode CG by means of an ONO film 9 formed of an oxide film 9a, a nitride film 9b and an oxide film 9c in this order as viewed from the side of the control gate electrode CG. The memory gate electrode MG is disposed on the main surface of the substrate 1 through the ONO film 9. These control gate electrode CG and memory gate electrode MG are, respectively, made of a polysilicon film doped with an impurity.

A silicide film 15 is formed over the control gate electrode CG, memory gate electrode MG and n-type diffusion layer 13 according to a salicide technique. The salicide technique used in the present invention is briefly illustrated. A cobalt (Co) film is, for example, formed over the main surface of the substrate 1 so as to cover the control gate electrode CG, the memory gate electrode MG and the like therewith and is subjected to a first thermal treatment (first annealing) to form a CoSi film on the silicon (Si) surfaces of the electrodes and the diffusion layer. Thereafter, an unreacted Co film is removed by wet etching, followed by a second thermal treatment (second annealing) to cause the CoSi film to be phase transformed into a $CoSi_2$ film. It will be noted that with the memory cell MC shown in FIG. 1, for example, the first annealing is carried out at about 420° C. in an atmosphere of 100% nitrogen, and the second annealing is effected at about 710° C. in an atmosphere containing oxygen.

As stated hereinabove, the control gate electrode CG and the memory gate electrode MG are mutually insulated by means of the ONO film 9 so that the selection MIS transistor and the memory MIS transistor are, respectively, operated.

Figure 2:
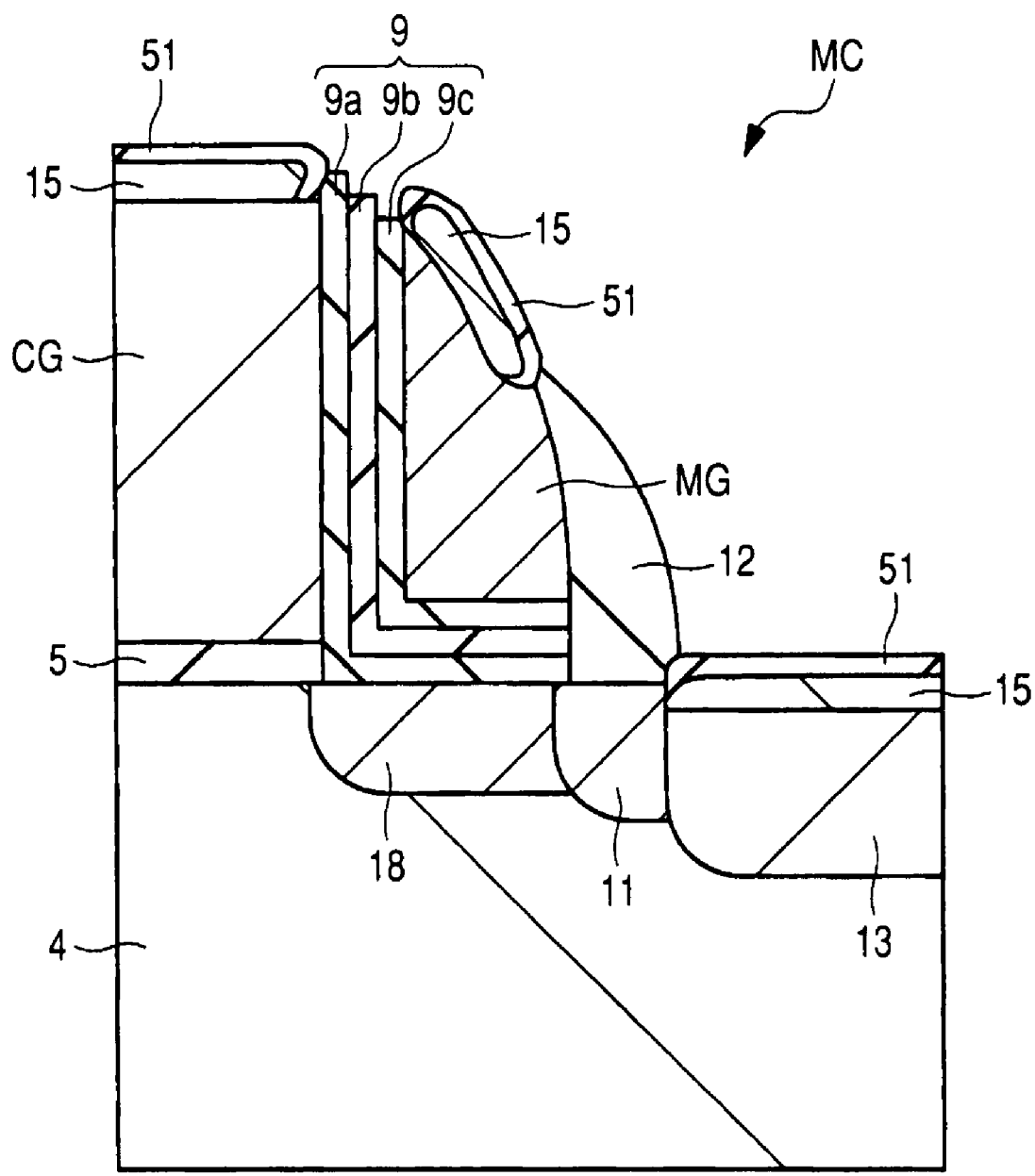
FIG. 2 is an enlarged view of a memory cell of FIG. 1.

FIG. 2 is an enlarged view of the memory device MC of FIG. 1. As shown in FIG. 2, an insulating film 51 is formed on the surface of the silicide film 15. In other words, this insulating film 51 is provided so as to cover the silicide film 15 therewith. This serves to suppress a leak between the control gate electrode CH and the memory gate electrode MG. More particularly, a margin against dielectric breakdown between the control gate electrode CG and the memory gate electrode MG can be improved.

Figure 3:
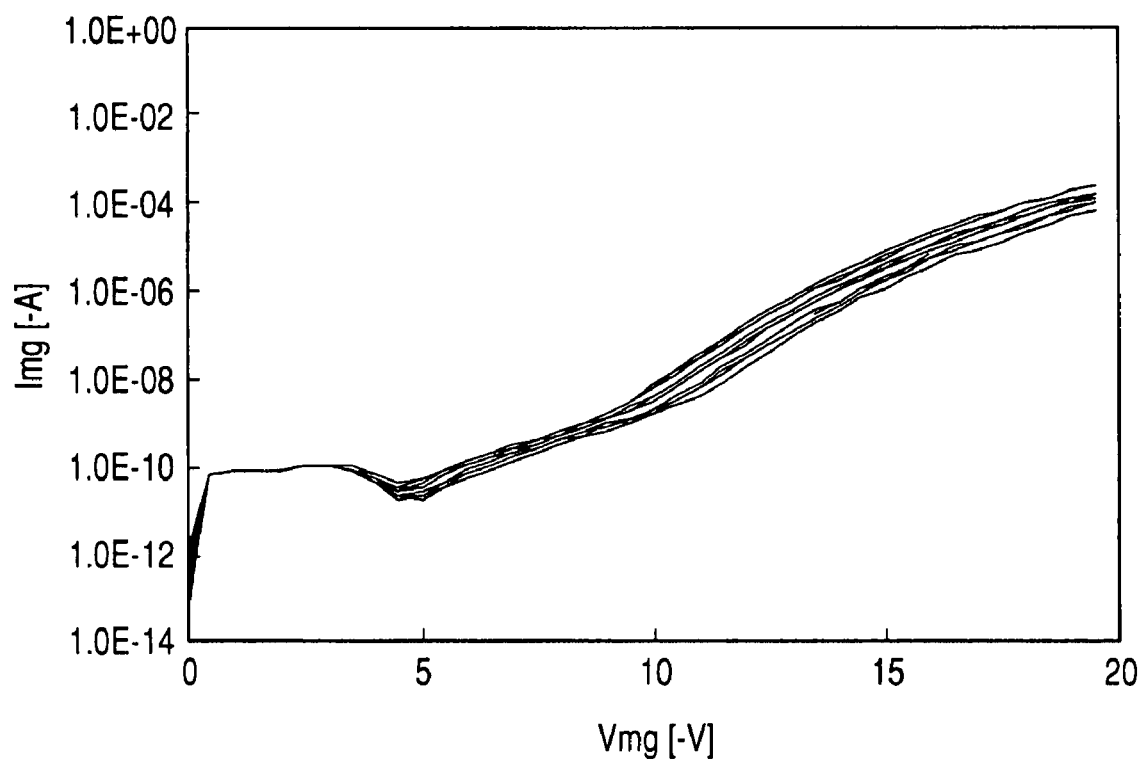
FIG. 3 is a graphical representation illustrating a withstand voltage characteristic between a control gate electrode and a memory gate electrode of the memory cell of FIG. 1.

FIG. 3 is a view illustrating the breakdown or withstand voltage characteristic between the control gate electrode and the memory gate electrode of the memory cell of FIG. 1. As shown in FIG. 3, the coverage of the silicide film 15 with the insulating film 51 enables a failure in short-circuiting to be reduced. That is, the withstand voltage between both gate electrodes can be improved. Especially, it will be seen that a short-circuiting suppressing effect in a high electric field region of a breakdown voltage of about 15V is great.

In this way, the provision of the insulating film on the silicide film can lead to an improvement in reliability of the semiconductor device.

Figure 4:
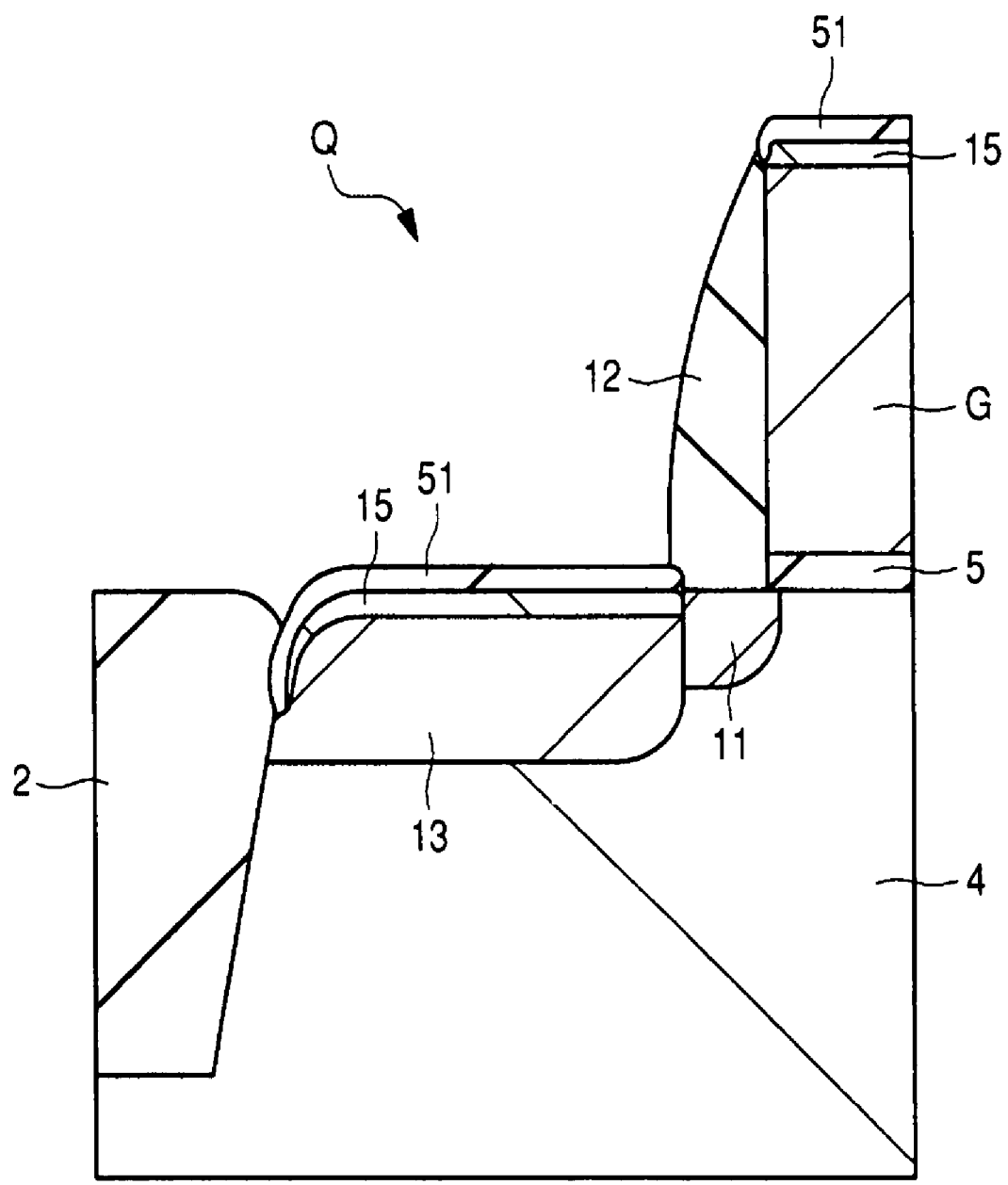
FIG. 4 is an enlarged view of a peripheral transistor of FIG. 1.

FIG. 4 is an enlarged view of the peripheral transistor of FIG. 1, in which a low withstand n-channel MIS transistor and an element isolation portion 2 are shown.

The source region (S) and the drain region (D) of the peripheral transistor Q are, respectively, made of an n-type diffusion layer 13 formed on the main surface of the substrate 1. The n-type diffusion layer 13 makes up of an LDD (lightly doped drain) structure along with an n-type diffusion layer 11.

A gate electrode G of the MIS transistor is disposed on the main surface of the substrate 1 between the source region and the drain region. The gate electrode G is formed on the main surface of the substrate 1 through a gate insulating film 5. This gate electrode G is made of a polysilicon film doped with an impurity.

A silicide film 15 is formed on the gate electrode G and the n-type diffusion layer 13 according to a salicide technique. The salicide technique used by us is described hereinafter.

The element isolation portion 2 is formed in a step of FIG. 5 described hereinafter, and the insulating film buried in the element isolation portion 2 is scraped off in cleaning and the like steps subsequent to FIG. 5, so that a boundary region with the active end becomes depressed.

As shown in FIG. 4, an insulating film 51 is formed on the surface of the silicide film 15 formed at the boundary region with the active end. That is, this insulating film 51 is formed so as to cover the silicide film 15 therewith. This coverage of the silicide film 15 with the insulating film 51 allows to prevent the leak between the silicide film 15 and the substrate 1 even if the element isolation portion 2 becomes depressed at the boundary region with the active end, thereby causing the distance between the silicide film 15 and the junction face of the n-type diffusion layer 13 and the p-type well 4 to come close to each other.

Likewise, the coverage of the silicide film 15 with the insulating film 51 allows to prevent a leak through the side wall 12 of the silicide film 16 of the control gate electrode CG even if the distance between the silicide film 15 and the upper portion of the control gate electrode CG comes close to each other.

Thus, the provision of the insulating film on the silicide film results in an improvement in reliability of the semiconductor device.

Next, the operations of the memory cell are illustrated. It will be noted that as shown in FIG. 1, the n-type diffusion layer 13 at the side of the control gate electrode CG is taken as a drain region (D) and the n-type diffusion layer 13 at the side of the memory gate electrode MG taken as a source region (S) for convenience of illustration.

The writing operation is carried out, for example, by applying 0.8 V to the drain region, 6V to the source region, 12V to the memory gate electrode MG, 1.5 V to the control gate electrode CG and 0 V to the p-type well 4, respectively, under which hot electrons are charged from the side of the channel-forming region beneath the memory gate electrode MG into the nitride film 9b of the ONO film 9.

The reading-out operation is carried out by applying, for example, 0 V to the drain region, 1.5 V to the source region, 1.5 V to both memory gate electrode MG and control gate electrode CG, and 0V to the p-type well 4, respectively.

The erasing operation may be performed by one of a first erasing method wherein electrons charged into the nitride film 9b are released to the memory gate electrode MG, a second erasing method wherein hot holes are charged from the channel-forming region beneath the memory gate electrode MG into the nitride film 9b, and a third method wherein electrons charged into the nitride film 9b are discharged to the channel forming region.

The first erasing method is carried out, for example, by applying 0 V to both source and drain regions, 15 V to the memory gate electrode MG, and 0 V to both control gate electrode CG and p-type well 4 to cause electrons to be tunneled into the oxide film 9c that is an upper layer of the ONO film 9 and discharged from the nitride film 9b into the memory gate electrode MG.

The second erasing method is carried out, for example, by applying 0V to the drain region, 7V to the source region, −6V to the memory gate electrode MG, and 0V to both control gate electrode CG and p-type well 4, respectively, thereby causing hot holes to be passed through the oxide film 9a used as the lower layer of the ONO film 9 and charged from the side of the channel forming region beneath the memory gate electrode MG into the nitride film 9b.

The third method is carried out, for example, by discharging the electrons, which is charged into the nitride film 9b, into the channel forming region. In this method, for example, 0V is applied to both source region and drain region, −15 V applied to the memory gate electrode MG and 0V applied to both control gate electrode CG and p-type well 4, respectively, thereby causing electrons to be tunneled into the oxide film 9a and discharged from the nitride film 9a into the channel forming region.

Next, the method of manufacturing a semiconductor device according to another embodiment of the invention is described with reference to the drawings. FIGS. 5 to 13 are, respectively, a sectional view schematically showing an essential part of the semiconductor device in the course of the manufacture according to this embodiment, in which a region forming a memory cell (memory region) and a region forming a peripheral transistor (peripheral region) are shown.

Figure 5:
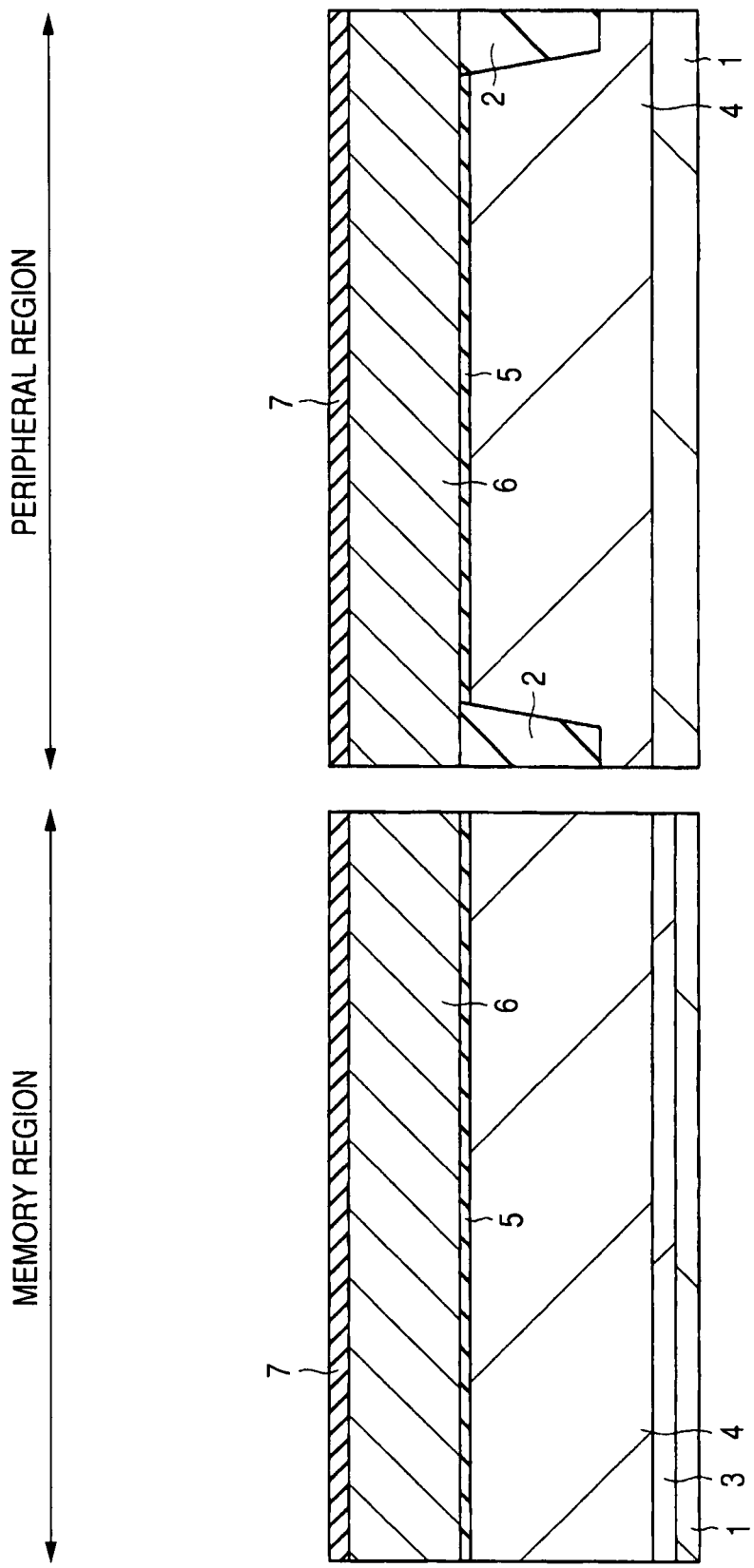
FIG. 5 is a schematic sectional view showing an essential part of a semiconductor device in a manufacturing step thereof according to another embodiment of the invention.

Initially, as shown in FIG. 5, a semiconductor substrate (hereinafter referred to simply as "substrate") 1 is provided. This substrate 1 is made, for example, of a p-type single crystal silicon substrate having a specific resistance of about 1 to 10 Ω·cm.

Next, an element isolation portion 2 is formed in a given region of a main surface (device forming surface) of the substrate 1. The element isolation portion 2 is to partition active regions (and active region and an element forming region) from each other, and is formed, for example, by forming an isolation groove at a given portion of the main surface of the substrate 1, after which an insulating film made, for example, of silicon oxide is polished by a CMP (chemical mechanical polishing) method.

Thereafter, a deep n-type well 3 is formed in the main surface of the substrate 1 at the memory region thereof. The deep n-type well 3 is formed, for example, by selective ion implantation of an n-type impurity of As (arsenic) or P (phosphorus). Next, a p-type well 4 is formed in the main surface of the substrate 1 at the memory region and peripheral region, respectively. This p-type well 4 is formed, for example, by selective ion implantation of a p-type impurity of B (boron). Subsequently, a channel-forming p-type semiconductor region (not shown) for a memory cell and a peripheral transistor is formed at the side of the main surface of the substrate 1 (i.e. the surface side of the p-type well 3). This p-type semiconductor region is formed, for example, by selective ion implantation of a p-type impurity of $BF_2$ (boron difluoride) into the p-type well 4.

Next, in order to prevent the impurity ion-implanted in the p-type well 4 from escaping, annealing is carried out in an atmosphere of about 1% of oxygen at about 1000° C. for about 30 seconds.

Thereafter, a gate insulating film 5 is formed on the main surface of the substrate 1. This gate insulating film 5 is made, for example, of a silicon oxide film about 3 nm thick that is formed by thermally treating the substrate 1 in an atmosphere of oxygen diluted with nitrogen.

Subsequently, a silicon film 6 is formed entirely over the main surface of the substrate 1 so as to cover the gate insulating film 5 therewith. This silicon film 6 is made, for example, of a polysilicon film about 250 nm thick, formed by a CVD (chemical vapor deposition) method, which is ion implanted with an impurity (e.g. As) to reduce the resistance of the polysilicon film. Thereafter, annealing in an atmosphere of about 1% of oxygen at about 950° C. for about 10 seconds is performed so as not to permit the impurity to escape from the silicon film 6.

Next, an insulating film 7 is formed entirely over the main surface of the substrate 1 so as to cover the silicon film 6 therewith. This insulating film 7 is formed as a cap film having the function as a mask layer for forming a control gate electrode after processing of the silicon film 6 and also as a protective film for protecting the control gate electrode from damage in a subsequent step. The insulating film 7 is made, for example, of silicon oxide formed in a thickness of about 50 nm by a CVD method.

Figure 6:
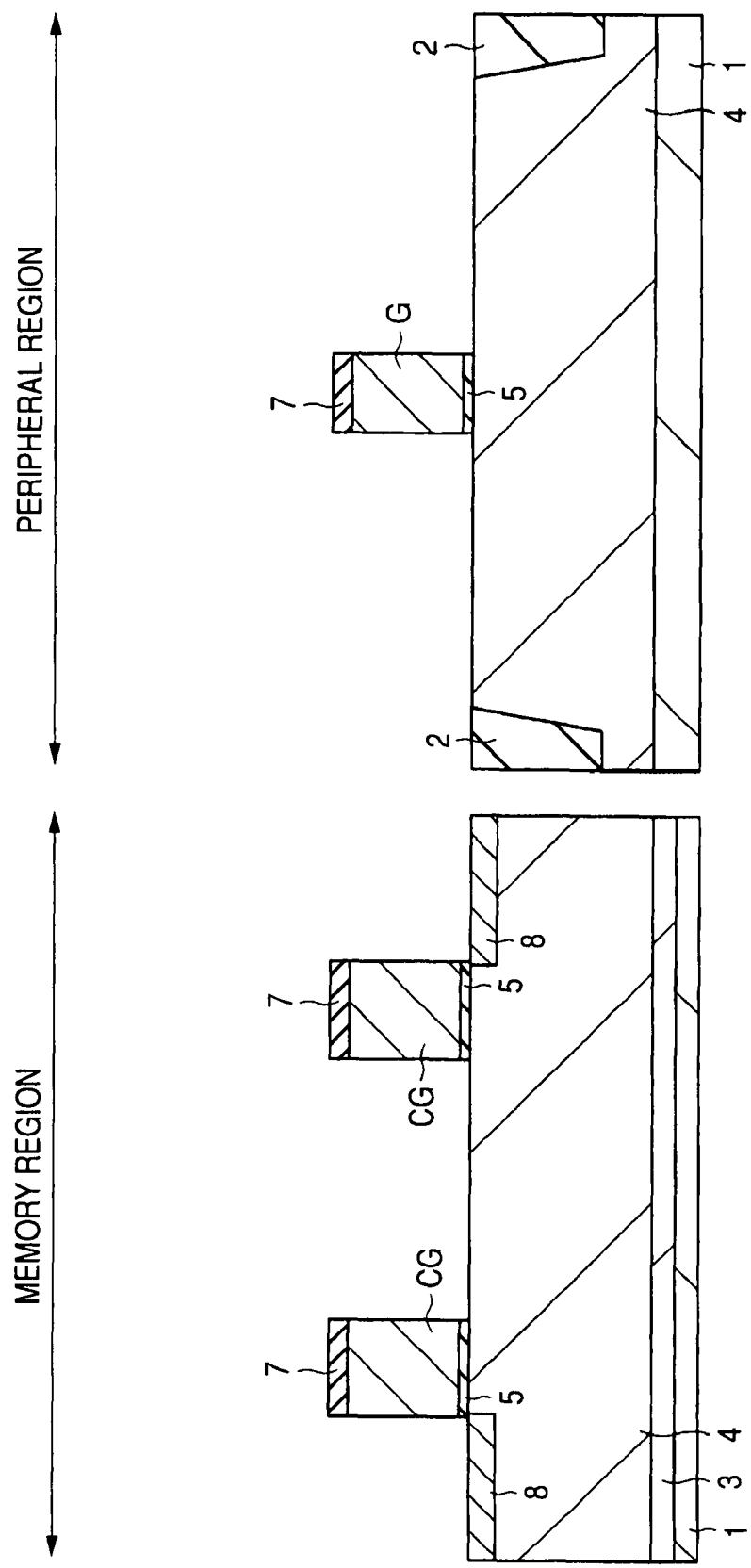
FIG. 6 is a schematic sectional view showing a step subsequent to FIG. 5.

Subsequently, as shown in FIG. 6, the insulating film 7 is patterned, after which the silicon film 6 is subjected to patterning using the insulating film 7 as a mask to form a gate electrode G in the peripheral region along with a control gate electrode CG formed in the memory region. It will be noted that the gate insulating film 5 is disposed between the control gate electrode CG and gate electrode G and the substrate 1.

Next, a p-type semiconductor region 8 is formed on the main surface of the substrate 1 at the memory region. The p-type semiconductor region 8 is formed, for example, by selective ion implantation of a p-type impurity of $BF_2$ into a portion of the memory region (active region), in which no control gate electrode CG is formed, in alignment with the control gate electrode CG.

Figure 7:
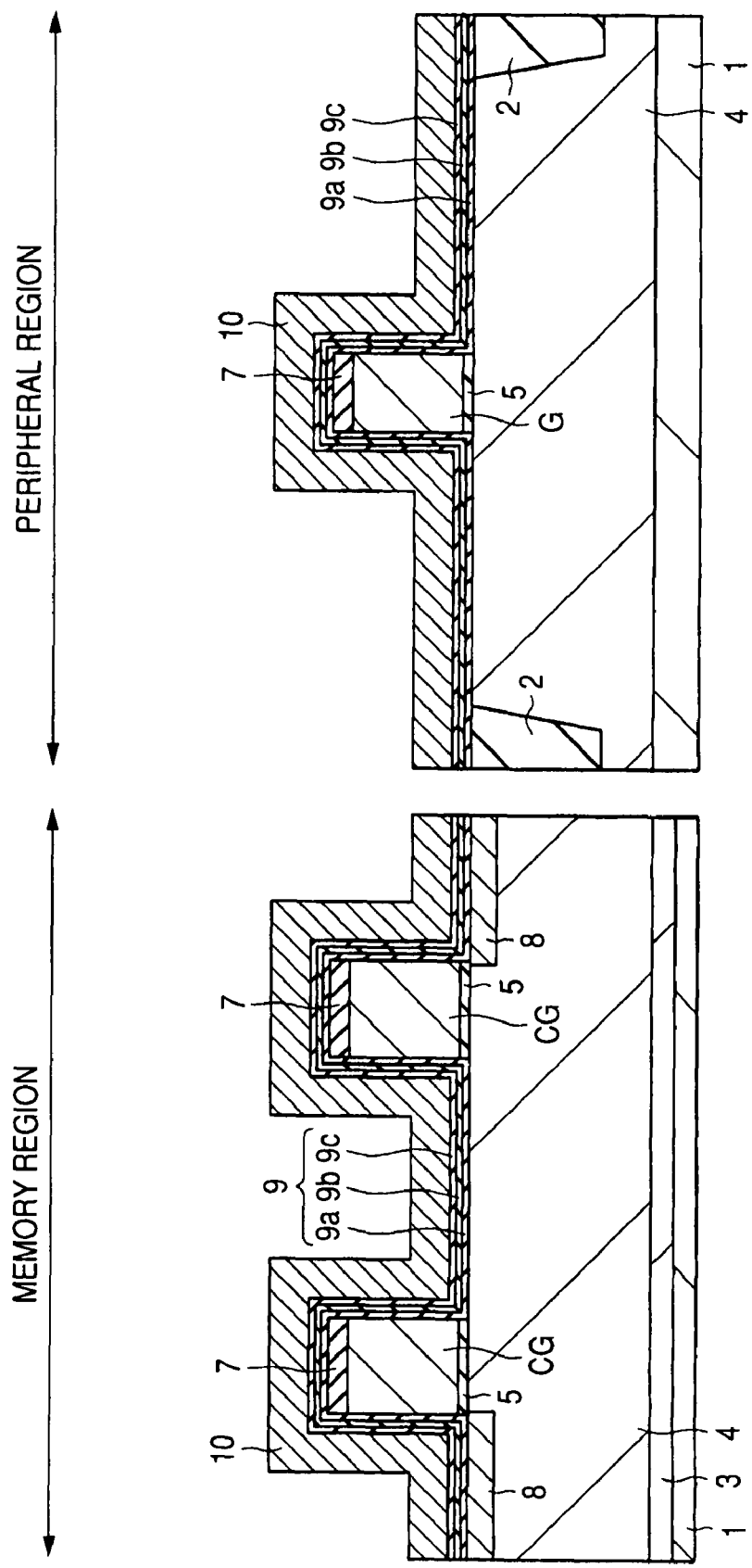
FIG. 7 is a schematic sectional view showing a step subsequent to FIG. 6.

As shown in FIG. 7, an oxide film 9a, a nitride film 9b and an oxide film 9c are stacked entirely over the main surface of the substrate 1 including the control gate electrode CG, followed by thermal treatment for densifying to form an ONO film 9. The oxide film 9a is made, for example, of a silicon oxide film about 5 nm thick formed by thermally treating the substrate 1 in an atmosphere of oxygen diluted with nitrogen. The nitride film 9b is made, for example, of an about 10 nm thick silicon nitride film formed entirely over the main surface of the substrate 1 including the oxide film 9a by a CVD method. The oxide film 9c is made, for example, of a silicon oxide film about 5 nm thick formed by a CVD method. It will be noted that the nitride film 9b may be made of an insulating film that contains nitrogen as a part of an oxide film, e.g. a silicon oxide nitride film. The silicon oxide nitride film is formed, for example, according to a CVD method wherein a mixed gas of a silane gas such as monosilane ($SiH_4$) and a dilution gas such as nitrous oxide ($N_2O$), helium (He) or the like is used.

Next, a silicon film 10 is formed entirely over the ONO film 9 so as to cover the control gate electrode CG therewith. The silicon film 10 is formed, for example, of a polysilicon film about 150 nm thick formed by a CVD method, which is subsequently ion implanted with an impurity to reduce the resistance thereof and annealed for activating the impurity.

Figure 8:
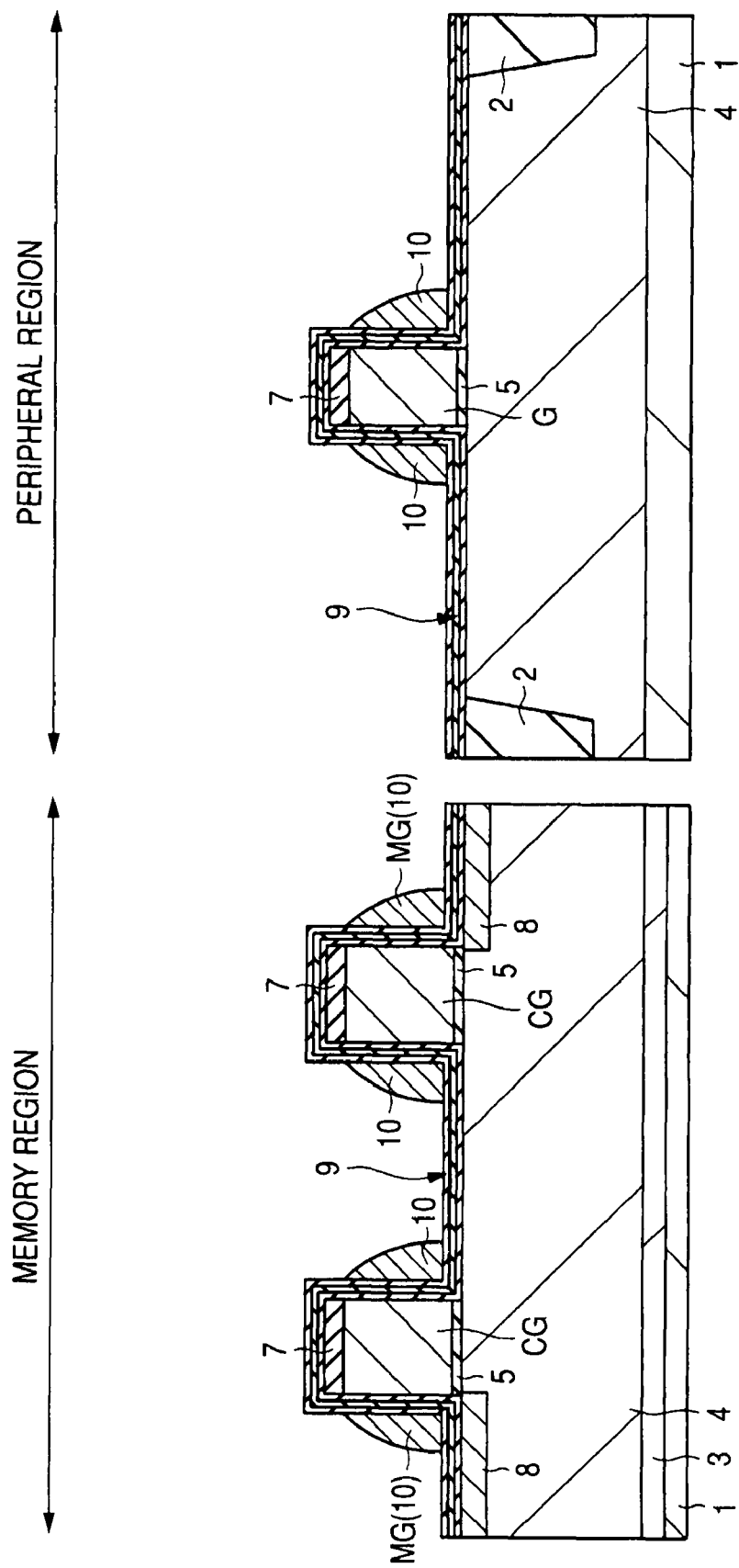
FIG. 8 is a schematic sectional view showing a step subsequent to FIG. 7.

Subsequently, as shown in FIG. 8, the silicon film 10 is anisotropically etched, for example, by RIE (Reactive Ion Etching) or the like. That is, a side wall-shaped memory gate electrode MG is formed at the side surface of the control gate electrode CG.

Figure 9:
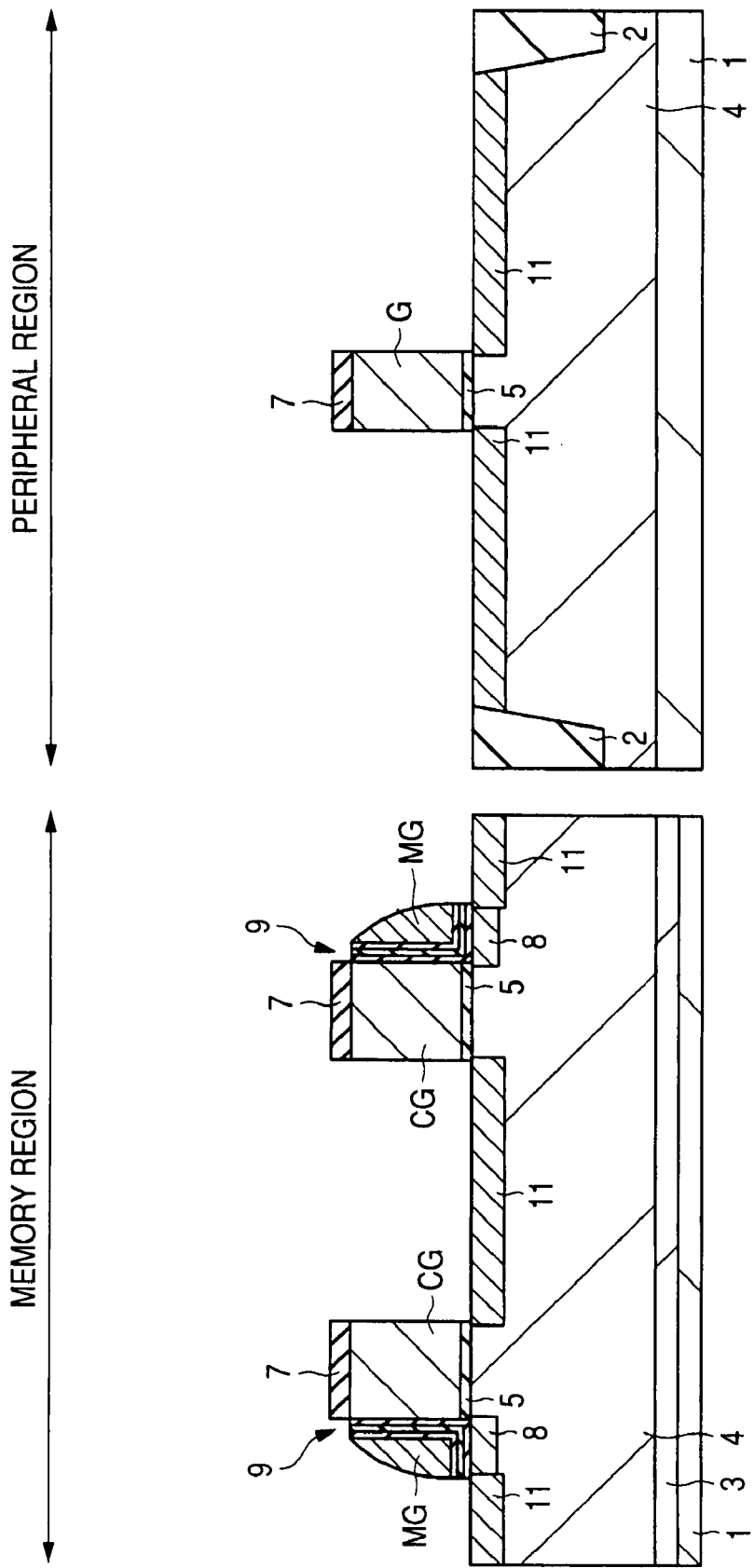
FIG. 9 is a schematic sectional view showing a step subsequent to FIG. 8.

Subsequently, as shown in FIG. 9, the silicon film 10 except for the memory gate electrode MG is removed by etching by use, as a mask, of a photoresist film (not shown) covering the memory gate electrode MG, after which the ONO film 9 is removed by selective etching.

An n-type diffusion layer (extension region) 11 is formed self-alignedly relatively to the one side surface of the control gate electrode CG, the memory gate electrode MG and the gate electrode G of the peripheral transistor. More particularly, this n-type diffusion layer (extension region) 11 is formed, for example, by ion implanting As or P into the main surface of the substrate 1 using the control gate electrode CG, memory gate electrode MG and gate electrode G of the peripheral transistor as a mask and annealing to activate the ions.

Next, in order to prevent the impurity ion-implanted into the substrate 1 from escaping, annealing is carried out in an atmosphere of about 1% of oxygen at about 900° C. for about 30 seconds.

Figure 10:
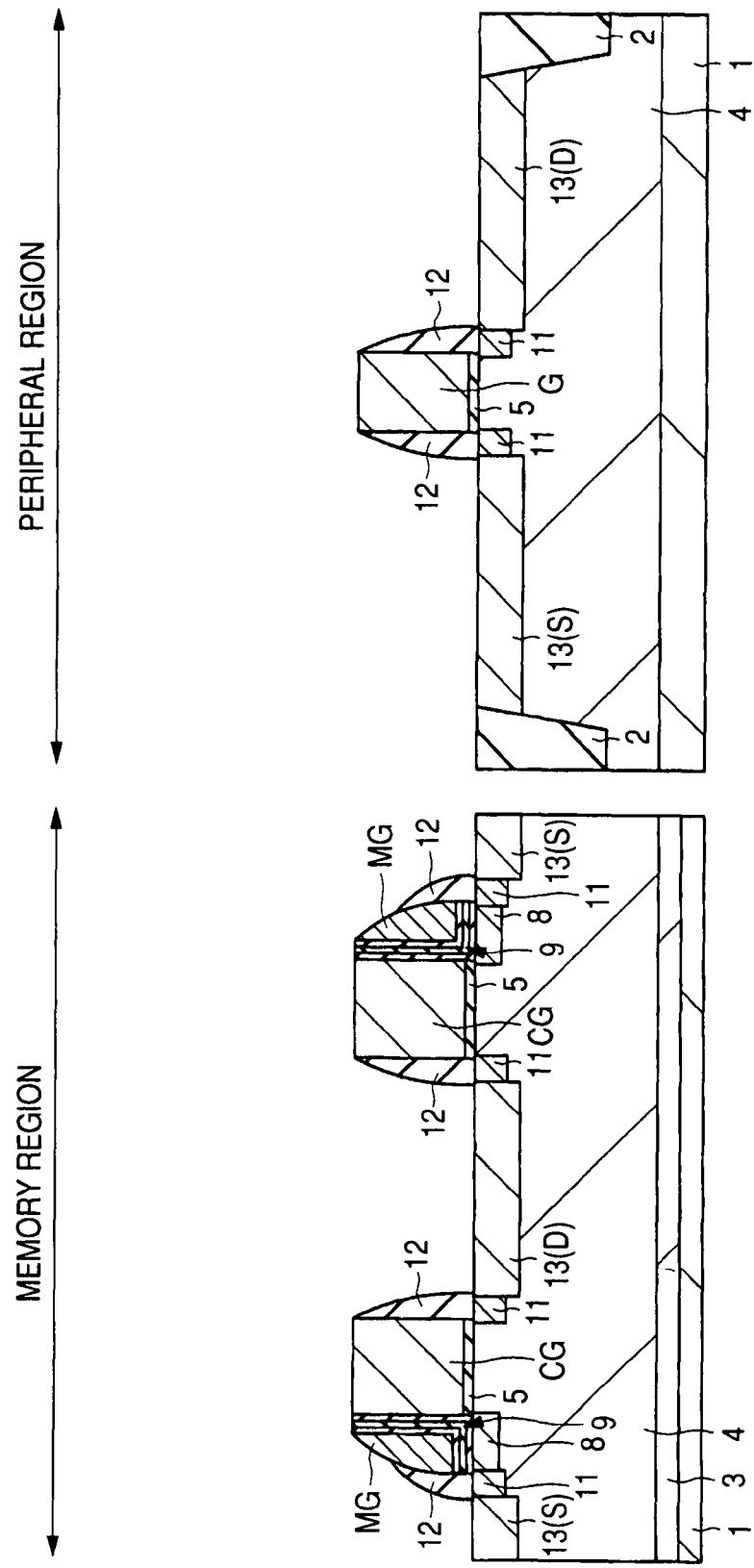
FIG. 10 is a schematic sectional view showing a step subsequent to FIG. 9.

Subsequently, as shown in FIG. 10, a side wall 12 is formed on the outer side of the memory gate electrode MG, a side surface of the control gate electrode CG that is an outer side opposite to the memory gate electrode MG, and both sides of the gate electrode G. The side wall 12 is formed, for example, by forming a silicon oxide film about 100 nm thick by a CVD method and anisotropically etching the silicon oxide film by RIE or the like.

An n-type diffusion layer (source and drain regions) 13 is formed on the main surface of the substrate 1. This n-type diffusion layer 13 is formed, for example, by selectively ion implanting an impurity, such as As, from the main surface side of the substrate 1 into a portion of the active region of the main surface.

Figure 11:
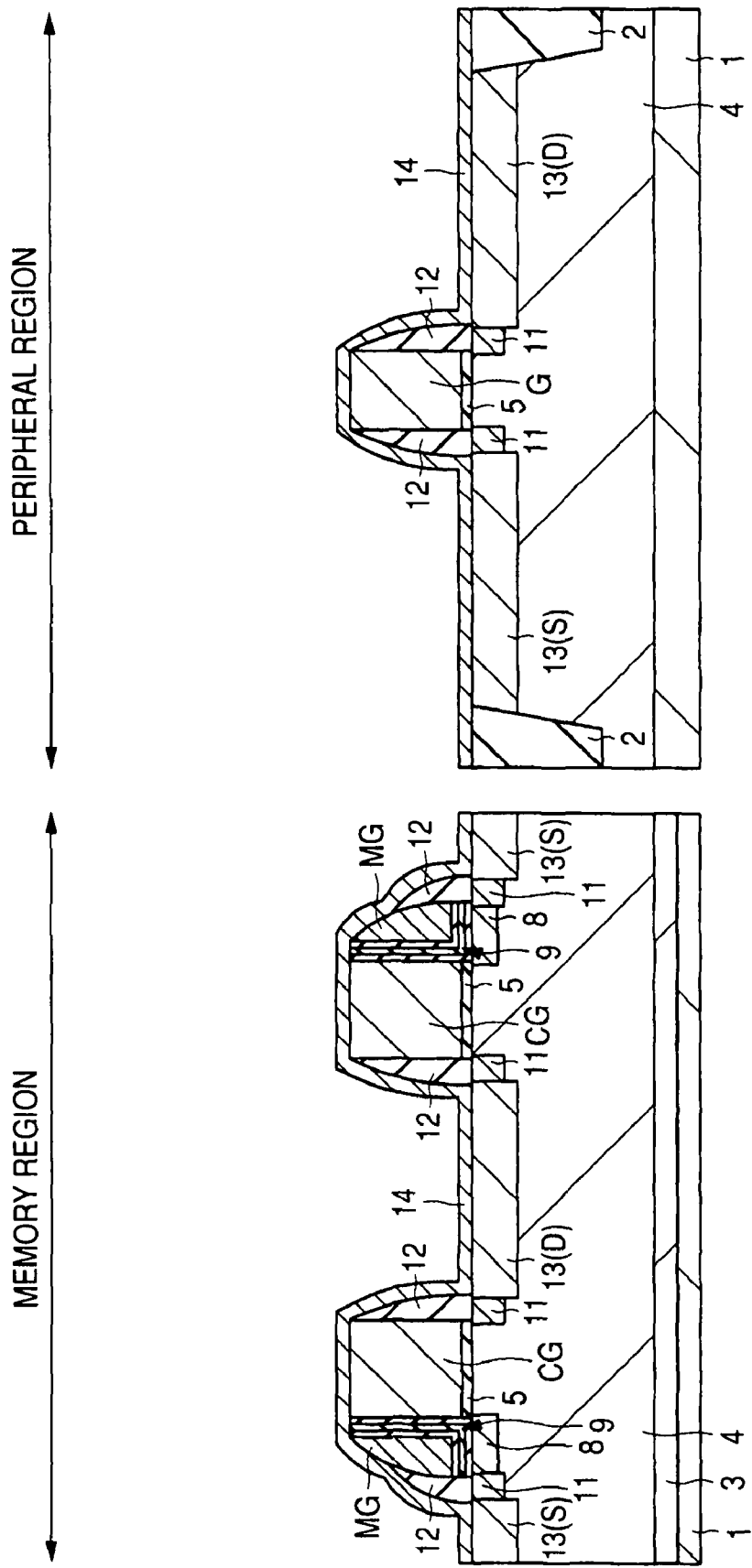
FIG. 11 is a schematic sectional view showing a step subsequent to FIG. 10.

Subsequently, after removal of a natural oxide film or the like, a metal film 14 is formed entirely over the main surface of the substrate 1 to cover the control gate electrode CG and memory gate electrode MG therewith as shown in FIG. 11. This metal film 14 is made, for example, of a cobalt (Co) film about 8 m thick formed by a sputtering method. It will be noted that although not shown in the figure, a titanium nitride (TiN) film is, for example, formed on the metal film 14 as an antioxidizing agent for inhibiting the oxidation of the cobalt film.

Figure 12:
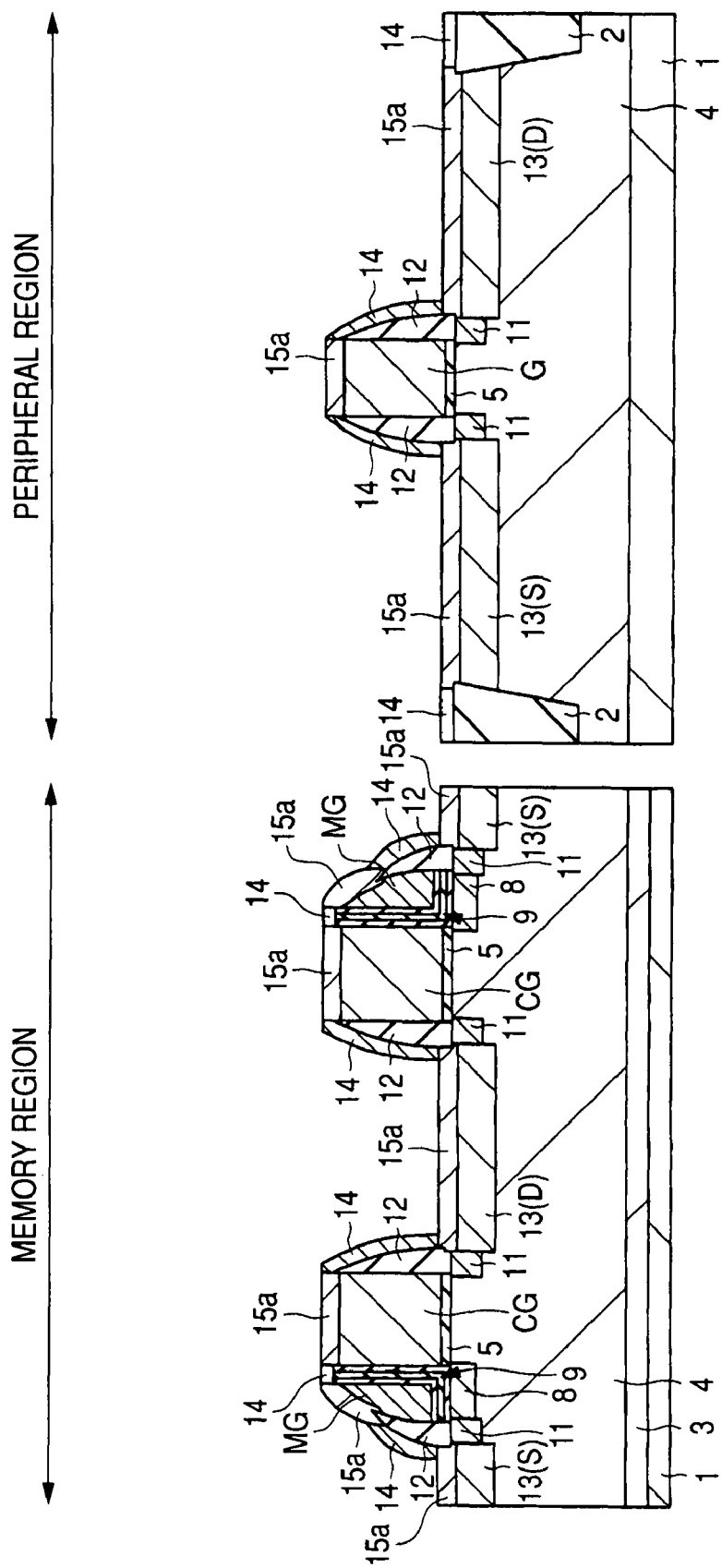
FIG. 12 is a schematic sectional view showing a step subsequent to FIG. 11.

As shown in FIG. 12, a silicide film 15a is formed on the control gate electrode CG, memory gate electrode MG, gate electrode G and n-type diffusion layer 13.

This silicide film 15a is made of a cobalt silicide film that is formed by a first thermal treatment (first annealing) wherein Si (silicon) in the control gate electrode CG, memory gate electrode MG, gate electrode G and n-type diffusion layer 13 and Co (cobalt) in the metal film 14 are reacted with each other. At this stage, the cobalt silicide film is formed of a mixture of CoSi and $CoSi_2$.

In this embodiment, the first thermal treatment conditions include a 100% nitrogen atmosphere, a substrate temperature of about 420° C. and a heating time of about 45 seconds. Where the silicide film 15a is formed, diffusion species for the silicide reaction become Co and Si. This entails diffusion of Co in the metal film 14 toward the control gate electrode CG, memory gate electrode MG, gate electrode G and n-type diffusion layer 13. Simultaneously, Si in the control gate electrode CG, memory gate electrode MG, gate electrode G and n-type diffusion layer diffuse toward the metal film 14.

The reason why the substrate temperature is set at about 420° C. is that because lateral diffusion of Si from the control gate electrode CG and memory gate electrode MG toward the metal film 14 becomes small, the formation of a silicide film on the ONO film 9 at the portion between the control gate electrode CG and the memory gate electrode MG can be suppressed. On the other hand, when the substrate temperature is set, for example, at about 470° C., a silicide film is formed on the ONO film between the control gate electrode CG and the memory gate electrode MG, and this silicide film causes a failure of short-circuiting between the control gate electrode CG and the memory gate electrode MG. Accordingly, the short-circuiting failure between the control gate electrode CG and the memory gate electrode MG can be suppressed when using a substrate temperature of about 420° C.

Figure 13:
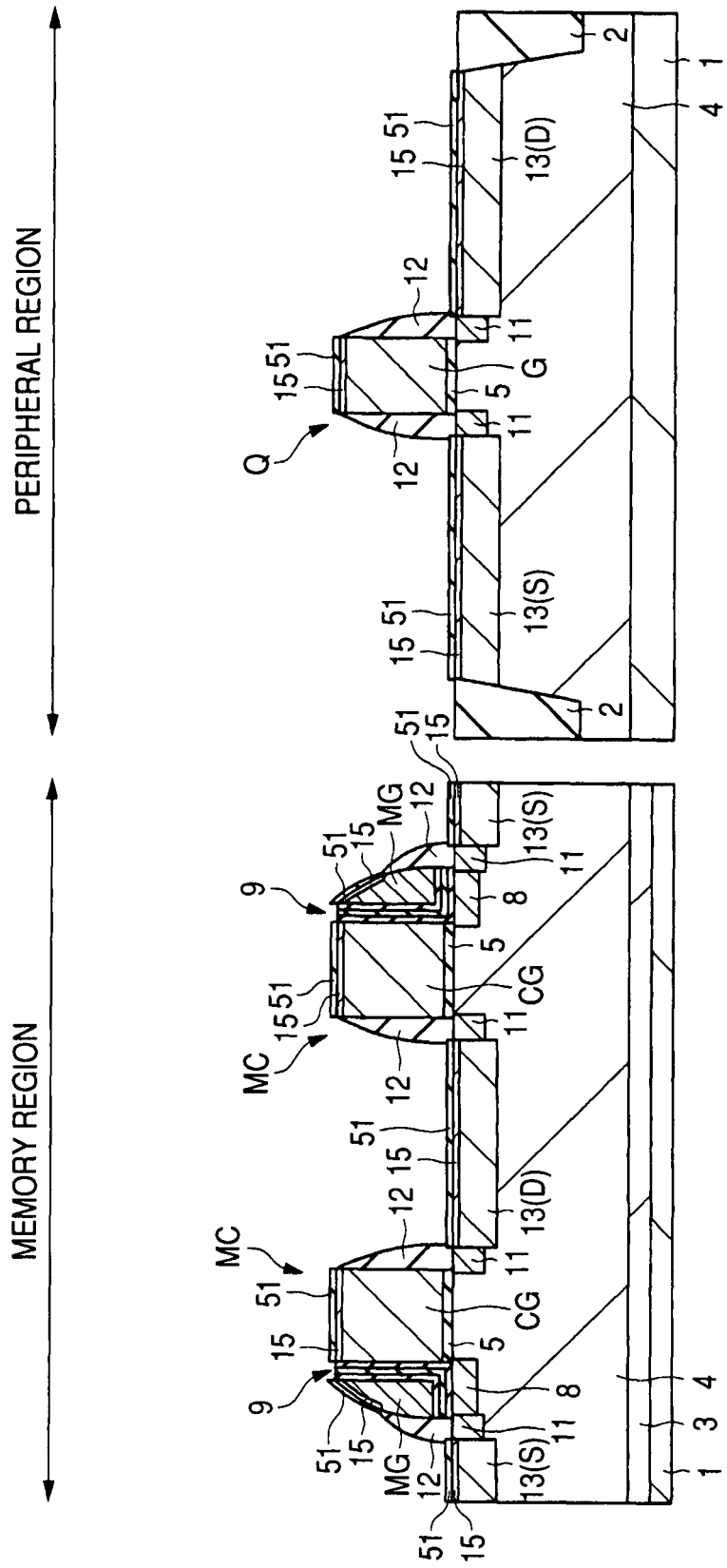
FIG. 13 is a schematic sectional view showing a step subsequent to FIG. 12.

Subsequently, in order to remove an unreacted metal film 14 and reduce the silicide film 15a in thickness, the metal film 14 and the silicide film 15a are, respectively, etched. Thereafter, as shown in FIG. 13, an silicide film 15 and an insulating film 51 covering the silicide film 15 therewith are, respectively, formed over the control gate electrode CG, memory gate electrode MG, gate electrode G and n-type diffusion layer 13. According to this step, the memory cell MC and the peripheral transistor Q are substantially completed in the memory region and the peripheral region, respectively.

This silicide film 15 is made of a cobalt silicide film, which is formed by subjecting the silicide film 15a on the control gate electrode CG, memory gate electrode MG, gate electrode G and n-type diffusion layer 13 to a second thermal treatment (second annealing) for phase transformation thereof. The cobalt silicide film at this stage consists of $CoSi_2$. The insulating film 51 is made of an oxide film formed by oxidation of the cobalt silicide film on the surface thereof along with the formation of the cobalt silicide film.

The second thermal treatment conditions in this embodiment include an atmosphere of oxygen whose concentration is at 100%, a substrate temperature of about 710° C. and a heating time of about 60 seconds. According to the second thermal treatment under such conditions as indicated above, the silicide film 51a made of CoSi is phase transformed into the silicide film 15 of $CoSi_2$ and at the same time, the cobalt silicide film is oxidized on the surface thereof to form the insulating film 51. This insulating film 51 is formed by the thermal oxidation of the cobalt silicide film, for which the silicide film 15 is covered therewith on the surface thereof. In this way, because of the coverage of the silicide film 15 with the oxide film, the withstand voltage, for example, between the control gate electrode CG and the memory gate electrode MG can be improved.

In order to permit CoSi to undergo phase transformation into $CoSi_2$, the substrate temperature in the second thermal treatment is made higher than the substrate temperature in the first thermal treatment. It will be noted that the reason why the substrate temperature in the first thermal treatment is made low is to prevent the formation of an additional silicide film to extents of the peripheral portion of the gate electrode (e.g. between the control gate electrode CG and the memory gate electrode MG) and also of the peripheral portion of the diffusion layer (e.g. the active end portion) because of the excessive progress of the diffusion reaction of Si.

Further, the ratio of nitrogen in the atmosphere of the second thermal treatment is made lower than a ratio of nitrogen in the atmosphere of the first thermal treatment. In the second thermal treatment, the cobalt silicide film is oxidized on the surface thereof, for which an oxygen gas is positively supplied to reaction between the cobalt silicide film and oxygen. On the other hand, if cobalt and oxygen are reacted in the first thermal treatment to form CoO nuclei, this CoO undergoes abnormal growth upon deposition of a nitride film after formation of the $CoSi_2$ film as a result of the second thermal treatment, thus making it impossible to form a cobalt silicide film of good quality. For this, the first thermal treatment is carried out in an atmosphere of nitrogen whose concentration is at 100%. In this way, the ratio of nitrogen in the atmosphere of the second thermal treatment is set at a level lower than a ratio of nitrogen in the atmosphere of the first thermal treatment.

As stated hereinbefore, for example, unlike the thermal treatment carried out in an atmosphere of about 1% of oxygen so as not to permit the impurity ion-implanted into the silicon films 6, 10 to escape therefrom, oxygen is positively supplied to form the oxide film for covering the silicide film therewith. More particularly, the ratio of oxygen in the atmosphere of the second thermal treatment becomes higher than a ratio of oxygen in the atmosphere of a thermal treatment that is carried out so that the ion-implanted impurity in the silicon films 6, 10 is not allowed to escape.

When the flow ratio of an oxygen gas used to carry out the oxidation of the cobalt silicide film is lowered, uniformity in thickness of the in-plane oxide film can be improved, thereby leading to improved variations in resistance. Accordingly, an oxide film covering the cobalt silicide film is formed by the second thermal treatment wherein the ratio of oxygen in the atmosphere is within a range of 5 to 100%.

As shown in FIG. 4 having referred to hereinbefore, an oxide covering the cobalt silicide film is likewise formed at the boundary region between the element isolation region 2 and the active region, so that the leak between the silicide film 15 and the substrate 1 can be prevented.

Next, a silicon nitride film 20 and an interlayer insulating film 16 are, respectively, formed entirely over the surface of the substrate 1 including the memory cell MC and the peripheral transistor Q by a CVD method, followed by flattening the surface thereof by a CMP method. Thereafter, a connection hole 17 is formed in the silicon nitride film 20 and interlayer insulating film 16 by etching. Thereafter, a conductive material such as a metal is buried inside the connection hole 17 to form a contact plug 18, and a wiring 19 is formed on the interlayer insulating film 16 to provide a structure shown in FIG. 1.

The conditions of forming the silicon nitride film are, for example, such that under conditions where the substrate temperature is kept at 400° C., a plasma CVD method is used for the film formation. For the starting gases used for this, there is used a mixed gas of $SiH_4$ (silane) and $NH_3$ (ammonia) or a mixed gas of $SiH_4$ (silane) and $N_2$ (nitrogen).

In the practice of the invention, the insulating film 51 covering the silicide film 15 therewith is formed. More particularly, the cobalt silicide film is thermally oxidized to form an oxide film (insulating film) to cover the cobalt silicide film therewith. The oxide film covering the cobalt silicide film is not normally formed or removed if formed in view of the problems such as of a variation in silicide resistance and non-conduction between the silicide film and the contact plug. In the invention, however, while the above problems are suppressed so as to inhibit a failure of short-circuiting between the control gate electrode and the memory gate electrode of the MONOS non-volatile memory device having a split structure, such an insulating film is formed to cover the silicide film on both control gate electrode and memory gate electrode.

Figure 14:
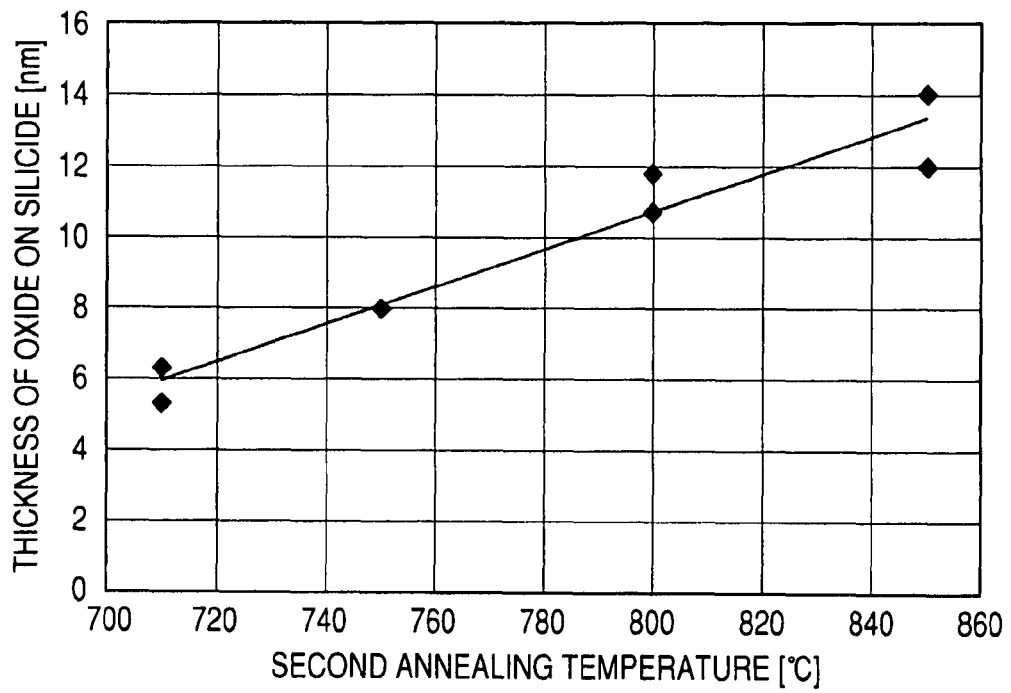
FIG. 14 is a graphical representation of a temperature dependence of a thickness of an oxide film formed on a silicide film.
Figure 15:
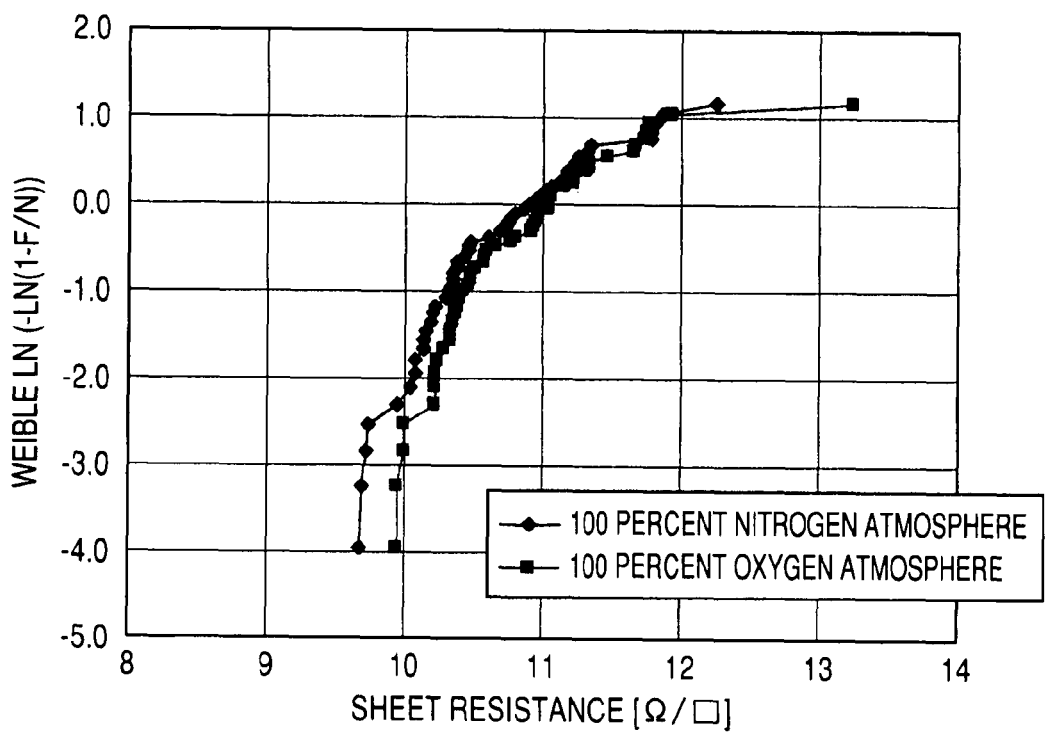
FIG. 15 is a graphical representation illustrating a cumulative frequency distribution of sheet resistance.
Figure 16:
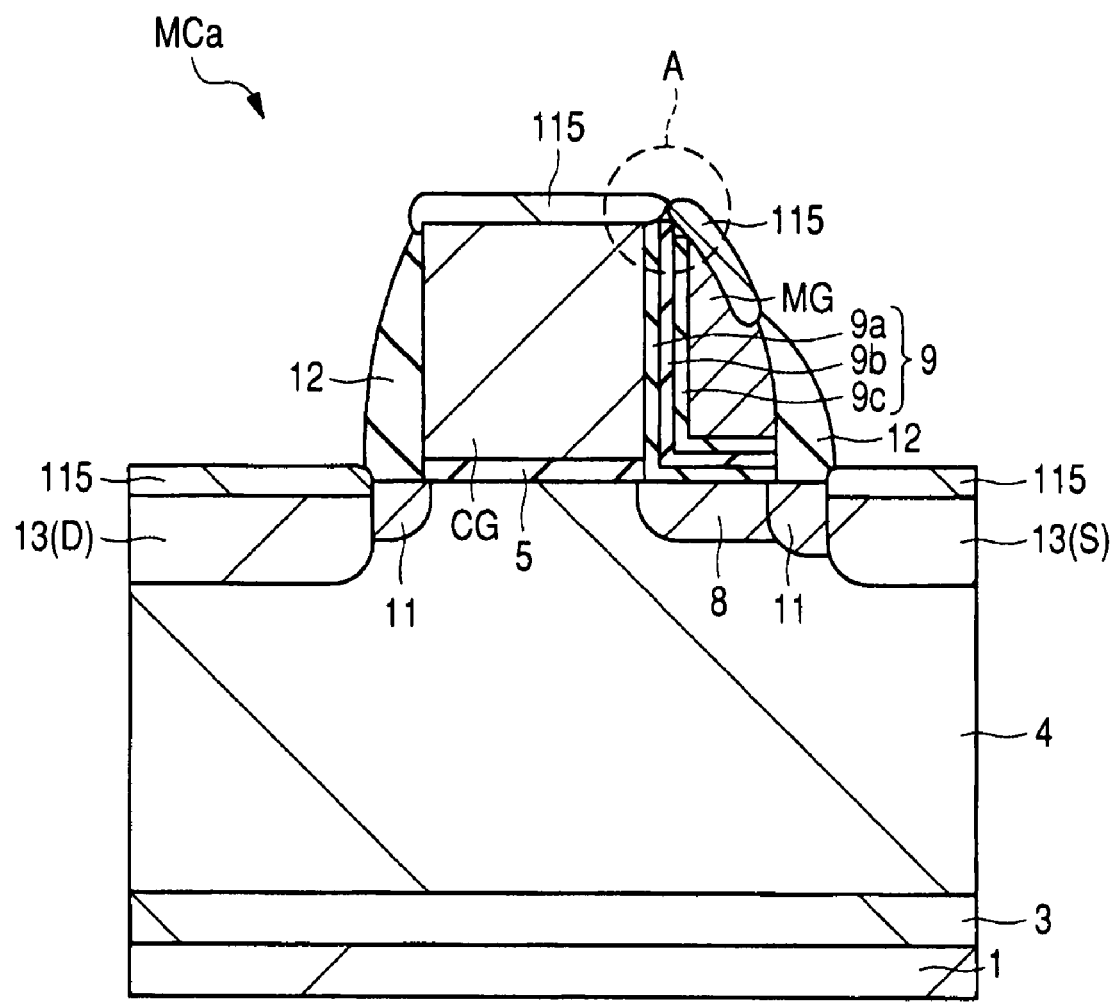
FIG. 16 is a schematic sectional view showing a memory cell checked by us.
Figure 17:
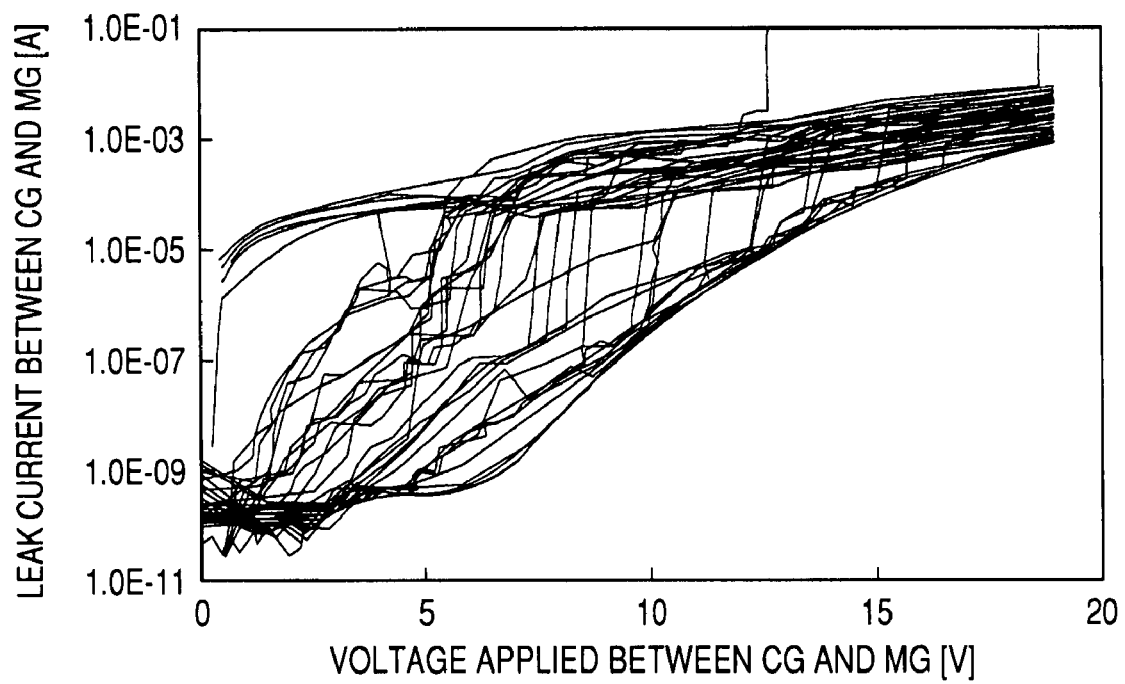
FIG. 17 is a graphical representation illustrating a withstand voltage characteristic between a control gate electrode and a memory gate electrode of a memory cell of FIG. 16.
Figure 18:
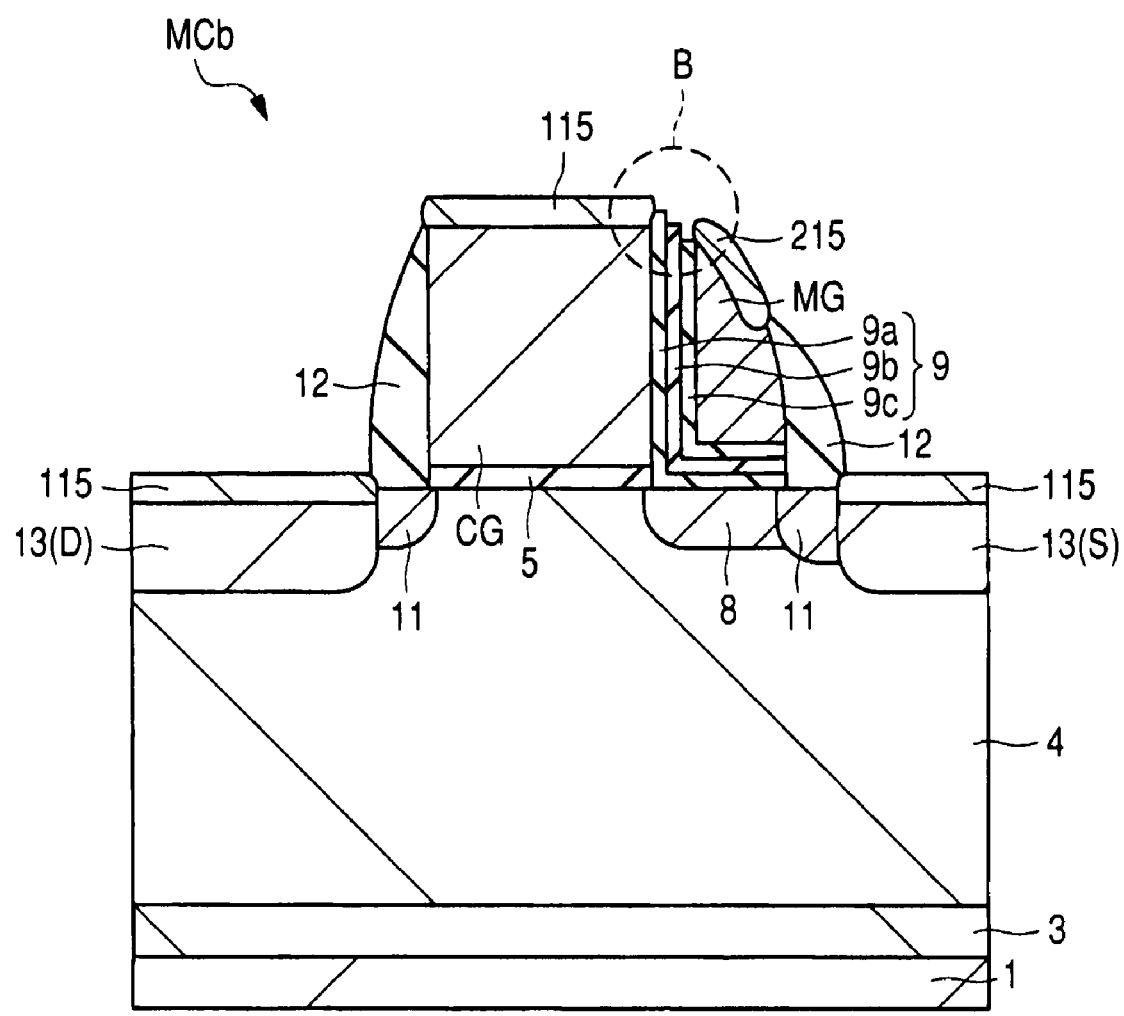
FIG. 18 is a schematic sectional view showing another type of memory cell checked by us.
Figure 19:
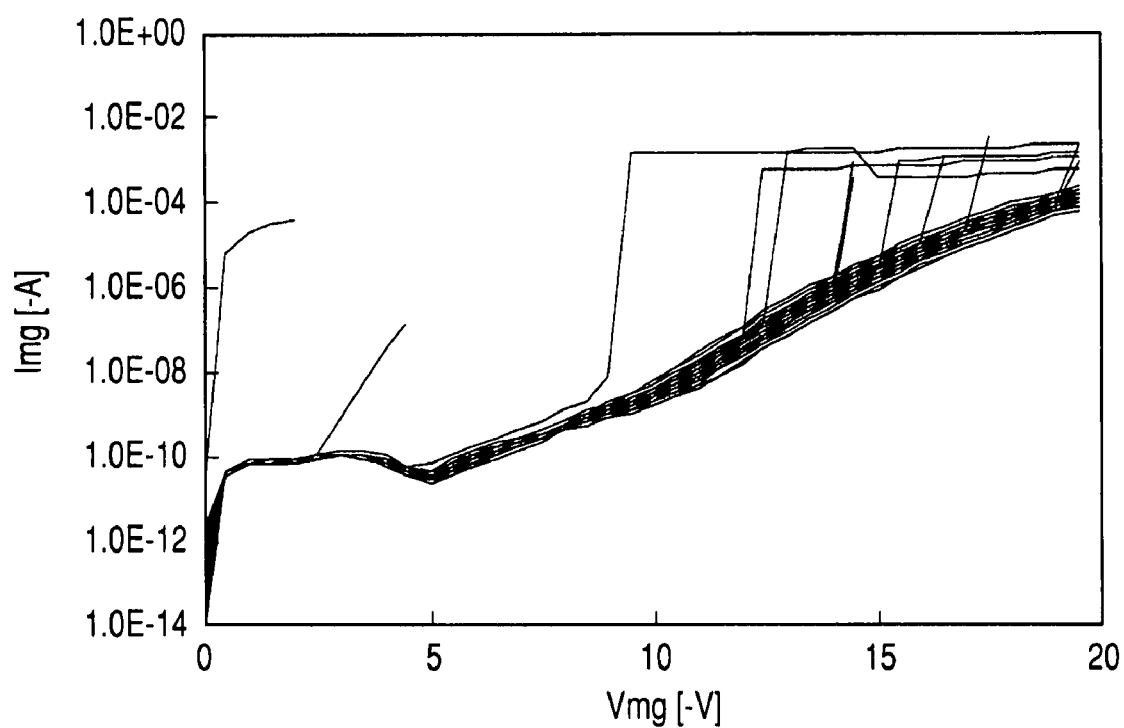
FIG. 19 is a graphical representation illustrating a withstand voltage characteristic between a control gate electrode and a memory gate electrode of a memory cell of FIG. 18.
Figure 20:
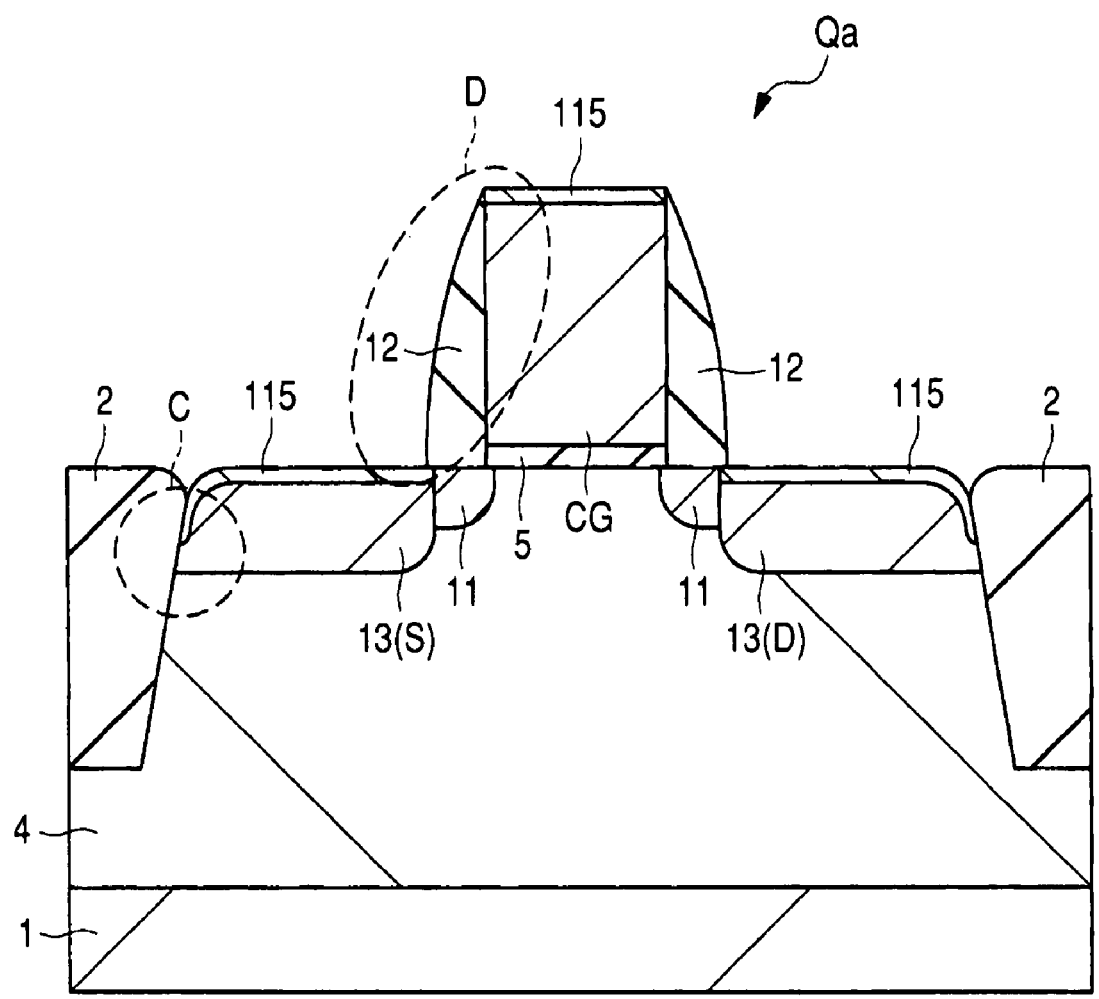
FIG. 20 is a schematic sectional view showing a peripheral transistor checked by us.

The cobalt silicide film formed by the second annealing and the oxide film formed thereon are illustrated with reference to FIGS. 14 and 15. FIG. 14 is a graph illustrating the temperature dependence of a thickness of the oxide film formed on the silicide film. FIG. 15 is a graph illustrating a cumulative frequency distribution of sheet resistance.

As shown in FIG. 14, it will be seen that the substrate temperature dependence of the oxide film thickness formed on the silicide film by the second annealing changes linearly. More particularly, a desired oxide film thickness can be obtained on the silicide film only when the substrate temperature is changed, which allows easy optimization with a margin for contact conduction and a margin for silicide resistance. Where the substrate temperature is at 680° C. or below, no reaction of cobalt occurs. On the other hand, when the temperature is not lower than 800° C., oxygen undergoes excessive reaction and the resulting sheet resistance increases with an increasing thickness of the oxide film. Moreover, if the diffusion layer is shallow, the junction face may be broken upon the formation of the silicide film. In this sense, the second annealing temperature should preferably be within a range of 680° C. to 800° C., more preferably 680° C. to 730° C. The thickness of the insulating film 51 in this embodiment is in the range of 3 nm to 7 nm, preferably at about 5 nm when taking into account the optimization with such a margin for contact conduction or a margin for silicide resistance.

When the thickness of the oxide film is optimized, a rise in sheet resistance can be minimized as is particularly shown in FIG. 15. It will be noted that the rise in resistance can be controlled within a given range (e.g. within a range where a short margin between the control gate electrode CG and the memory gate electrode MG is ensured) by controlling the thickness of a sputtered film (cobalt film). Since uniformity in thickness of an in-plane oxide film can be improved by lowering a flow ratio of a feed gas for oxidation, an improvement in variation of resistance is possible.

Thus, the oxide film covering the cobalt silicide can suppress a failure in short-circuiting, for example, between the control gate electrode and the memory gate electrode while suppressing the problems such as a variation in silicide resistance and the non-conduction between the silicide film and the contact plug. In other words, when the thermal treatment is carried out under such conditions as set out hereinabove, there can be obtained a semiconductor device wherein a failure in short-circuiting between the control gate electrode and the memory gate electrode is suppressed.

Although the present invention made by the inventors has been particularly described based on the embodiments, the invention should not be construed as limiting thereto and many variations and alterations are possible without departing from the spirit of the invention.

For instance, although the case where a silicon substrate is applied to as a semiconductor substrate in the foregoing embodiments has been described, an SOI substrate may also be used. The SOI substrate used herein means one that has a structure wherein an insulator layer is formed on a support substrate and a silicon layer made of semiconductor silicon is further formed on the insulator layer.

Further, although the case where Co (cobalt) is applied to as a material for a metal film reacted with silicon according to the salicide technique has been illustrated, for example, in the foregoing embodiments, high melting metal materials other than Co (e.g. Ni, W, Ti and the like) may be used. In such a case, an oxide film is formed on a silicide film in accordance with the invention, so that a leak failure, for example, between microfabricated, narrowed electrodes can be suppressed.

Thus, the invention has wide utility in the field of manufacturing semiconductor devices.

What is claimed is:

1. A method of manufacturing a semiconductor device having an MIS transistor including a silicon substrate, a gate insulating film formed over a main surface of the silicon substrate, a gate electrode including a silicon film formed over the silicon substrate through the gate insulating film, a side wall formed on a side surface of the gate electrode, and diffusion layers formed in the silicon substrate in self-alignment with the side wall, the method comprising the steps of:
    (a) forming a metal film over the main surface of the silicon substrate so as to cover the gate electrode therewith;
    (b) after the step (a), reacting the silicon film of the gate electrode with the metal film and also the diffusion layers with the metal film through a first thermal treatment to form first silicide films over an upper portion of the gate electrode and upper portions of the diffusion layers, respectively;
    (c) after the step (b), removing the metal film left unreacted); and
    (d) after the step (c), subjecting the first silicide films to phase transformation by a second thermal treatment in an atmosphere containing oxygen to form second silicide films and oxidation products of the metal film on surfaces of the second silicide films,
    wherein a ratio of oxygen in an atmosphere of the second thermal treatment is larger than a ratio of oxygen in an atmosphere of the first thermal treatment.

2. The method according to claim 1,
    wherein the first thermal treatment is carried out in an atmosphere of nitrogen, and a ratio of nitrogen in an atmosphere of the second thermal treatment is lower than a ratio of nitrogen in an atmosphere of the first thermal treatment.

3. The method according to claim 1,
    wherein a temperature of the silicon substrate in the second thermal treatment is higher than a temperature of the silicon substrate in the first thermal treatment.

4. The method according to claim 1,
    wherein the temperature of the silicon substrate in the second thermal treatment is at 680° C. to 800° C.

5. The method according to claim 1,
    wherein the temperature of the silicon substrate in the second thermal treatment is at 680° C. to 730° C.

6. The method according to claim 1, further comprising the steps of:
    (e) forming a polysilicon film over the gate insulating film to implant an ion into the polysilicon film; and
    (f) after the step (e), forming the silicon film having the polysilicon film by a third thermal treatment in an atmosphere containing oxygen,
    wherein a ratio of oxygen in the atmosphere of the second thermal treatment is higher than a ratio of oxygen in an atmosphere of the third thermal treatment.

7. The method according to claim 1,
    wherein a ratio of oxygen in the atmosphere of the second thermal treatment ranges 5% to 100%.

8. The method according to claim 1,
    wherein the metal film is a cobalt film, a nickel film, a tungsten film, or a titanium film.

9. The method according to claim 1,
    wherein, in the step (b), oxidation products of the metal film are not formed on surfaces of the first silicide films.

10. A method of manufacturing a semiconductor device having a non-volatile memory device including a silicon substrate, a first insulating film formed over a main surface of the silicon substrate, a control gate electrode including a silicon film formed over the silicon substrate through the first insulating film, a second insulating film formed along a side wall of the control gate electrode and the main surface of the silicon substrate, and a memory gate electrode including a second silicon film formed over the side wall of the control gate electrode and the main surface of the silicon substrate, the method comprising the steps of:

(a) forming a metal film over the main surface of the silicon substrate so as to cover the control gate electrode and the memory gate electrode therewith;

(b) after the step (a), reacting the first silicon film with the metal film and also the second silicon film with the metal film through a first thermal treatment to form first silicide films over an upper portion of the control gate electrode and an upper portion of the memory gate electrode, respectively;

(c) after the step (b), removing the metal film left unreacted; and (d) after the step (c), subjecting the first silicide films to phase transformation by a second thermal treatment in an atmosphere containing oxygen to form second silicide films and oxidation products of the metal film on surface of the second silicide films, wherein a ratio of oxygen in an atmosphere of the second thermal treatment is larger than a ratio of oxygen in an atmosphere of the first thermal treatment.

11. The method according to claim 10, wherein the first thermal treatment is carried out in an atmosphere of nitrogen, and a ratio of nitrogen in the atmosphere of the second thermal treatment is smaller than a ratio of nitrogen in the atmosphere of the first thermal treatment.

12. The method according to claim 10, wherein a temperature of the silicon substrate in the second thermal treatment is higher than a temperature of the silicon substrate in the first thermal treatment.

13. The method according to claim 10, wherein the temperature of the silicon substrate in the second thermal treatment is at 680° C. to 800° C.

14. The method according to claim 10, wherein the temperature of the silicon substrate in the second thermal treatment is at 680° C. to 730° C.

15. The method according to claim 10, further comprising the steps of:

(e) forming a polysilicon film over the gate insulating film to implant an ion into the polysilicon film; and (f) after the step (e), forming the silicon film made of the polysilicon film by a third thermal treatment in an atmosphere containing oxygen, wherein a ratio of oxygen in the atmosphere of the second thermal treatment is higher than a ratio of oxygen in an atmosphere of the third thermal treatment.

16. The method according to claim 10, wherein a ratio of oxygen in the atmosphere of the second thermal treatment ranges 5% to 100%.

17. The method according to claim 10, wherein the metal film is a cobalt film, a nickel film, a tungsten film, or a titanium film.

18. The method according to claim 10, wherein, in the step (b), oxidation products of the metal film are not formed on surfaces of the first silicide films.

19. A method of manufacturing a semiconductor device comprising:

(a) forming a gate insulating film over a silicon substrate;

(b) after the step (a), forming a gate electrode including a silicon film over the gate insulating film;

(c) after the step (b), forming a side wall over a side surface of the gate electrode;

(d) after the step (c), forming diffusion layers in the silicon substrate by an ion implantation;

(e) after the step (d), forming a metal film over the gate electrode, the side wall and the diffusion layers;

(f) after the step (e), reacting the silicon film of the gate electrode with the metal film and also the diffusion layers with the metal film through a first thermal treatment to form first silicide films over an upper portion of the gate electrode and upper portions of the diffusions layers, respectively;

(g) after the step (f), removing the unreacted metal film; and (h) after the step (g), subjecting the first silicide films to phase transformation by a second thermal treatment to form second silicide films, wherein a ratio of oxygen in an atmosphere of the second thermal treatment is larger than a ratio of oxygen in an atmosphere of the first thermal treatment, and wherein, in the step (h), oxidation products of the metal film are formed on surfaces of the second silicide films.

20. The method according to claim 19, wherein, in the step (f), oxidation products of the metal film are not formed on surfaces of the first silicide films.

21. The method according to claim 19, wherein the first thermal treatment is carried out in an atmosphere of nitrogen, and a ratio of nitrogen in the atmosphere of the second thermal treatment is lower than a ratio of nitrogen in the atmosphere of the first thermal treatment.

22. The method according to claim 19, wherein a temperature of the silicon substrate in the second thermal treatment is higher than a temperature of the silicon substrate in the first thermal treatment.

23. The method according to claim 22, wherein the temperature of the silicon substrate in the second thermal treatment is at 680° C. to 800° C.

24. The method according to claim 19, wherein the step (b) includes:

(b1) forming a polysilicon film over the gate insulating film;

(b2) after the step (b1), implanting an ion into the polysilicon film; and (b3) after the step (b2), executing a third thermal treatment in an atmosphere containing oxygen, wherein a ratio of oxygen in the atmosphere of the second thermal treatment is higher than a ratio of oxygen in an atmosphere of the third thermal treatment.

25. The method according to claim 19, wherein a ratio of oxygen in the atmosphere of the second thermal treatment ranges 5% to 100%.

26. The method according to claim 19, wherein the metal film is a cobalt film, a nickel film, a tungsten film, or a titanium film.

* * * * *